(12) United States Patent
Balegar et al.

(10) Patent No.: US 10,122,380 B2
(45) Date of Patent: Nov. 6, 2018

(54) COMPRESSION OF JAVASCRIPT OBJECT NOTATION DATA USING STRUCTURE INFORMATION

(71) Applicant: International Business Machines Corporation, Armonk, NY (US)

(72) Inventors: Umesh Kumar Balaraj Balegar, Danbury, CT (US); Logeswaran T. Rajamanickam, Tirupur (IN); Ashrith Shetty, Karnataka (IN); Rohit Shetty, Karnataka (IN)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 14/941,831

(22) Filed: Nov. 16, 2015

(65) Prior Publication Data

US 2017/0141791 A1 May 18, 2017

(51) Int. Cl.
*G06F 7/00* (2006.01)
*H03M 7/30* (2006.01)
*G06F 17/30* (2006.01)

(52) U.S. Cl.
CPC ........ *H03M 7/60* (2013.01); *G06F 17/30327* (2013.01); *G06F 17/30536* (2013.01); *H03M 7/3079* (2013.01); *H03M 7/707* (2013.01)

(58) Field of Classification Search
CPC ...... H03M 7/60; H03M 7/3079; H03M 7/707; H03M 7/55; H03M 7/6005; H03M 7/6011; H03M 7/30; G06F 17/30536; G06F 17/30327; G06F 17/30286; G06F 17/3027; G06F 17/30961; G06Q 10/10

USPC ....... 707/693, 713, 716, 797, 802, 803, 812, 707/821, 688; 715/234
See application file for complete search history.

(56) References Cited

U.S. PATENT DOCUMENTS

| | | | |
|---|---|---|---|
| 7,886,223 B2 | 2/2011 | Shetty et al. | |
| 7,925,643 B2* | 4/2011 | Balegar | G06F 17/227 707/713 |
| 8,260,784 B2* | 9/2012 | Beyer | G06F 17/30864 707/742 |
| 2013/0086100 A1* | 4/2013 | de Cerqueira Gatti | G06F 17/3092 707/769 |
| 2014/0244602 A1 | 8/2014 | Rastogi et al. | |
| 2015/0317327 A1* | 11/2015 | He | G06F 17/30327 707/693 |
| 2015/0339268 A1* | 11/2015 | Bednarz, Jr. | G06F 17/30896 715/248 |
| 2016/0117410 A1* | 4/2016 | Kamiya | G06F 17/30958 715/242 |

OTHER PUBLICATIONS

"JSON Compression : Transpose & Binary", retrieved from http://mainroach.blogspot.com/2013/08/json-compression-transpose-binary.html; Aug. 2013.
"JSON Schema and Hyper-Schema"; retrieved from http://json-schema.org/; as early as Jul. 2008.

(Continued)

*Primary Examiner* — Greta L Robinson
(74) *Attorney, Agent, or Firm* — Brown & Michaels, PC; Maeve Carpenter

(57) ABSTRACT

A method for encoding and decoding a javascript object notation (JSON) document utilizing a statistical tree representing a JSON Schema. The encoded statistical tree may be optimized.

25 Claims, 21 Drawing Sheets

(56) References Cited

OTHER PUBLICATIONS

"Compress your JSON with automatic type extraction"; retrieved from http://stevehanov.ca/blog/index.php?id=104; as early as Aug. 2010.
"SmileFormatSpec—FasterXML Wiki"; retrieved from http://wiki.fasterxml.com/SmileFormatSpec; Edited May 2014; Copyrighted 2009.
"It's like JSON. but fast and small.", retrieved from http://msgpack.org/; as early as Jun. 2010.
"BSON—Binary JSON", retrieved from http://bsonspec.org/; as early at Feb. 2010.
"The JSON Data Interchange Format" Standard ECMA-404; 1st Edition; ECMA International Oct. 2013.

\* cited by examiner

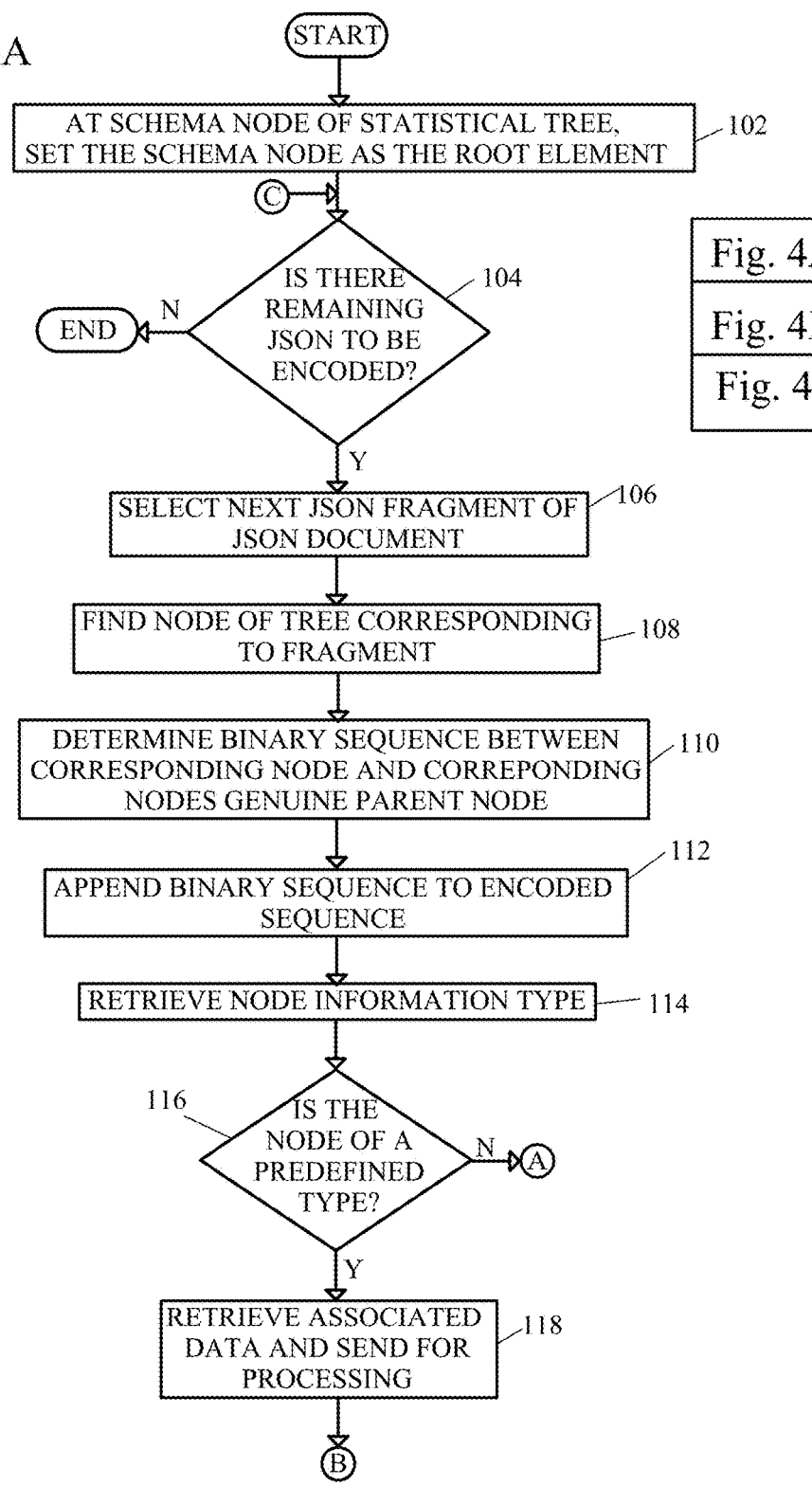

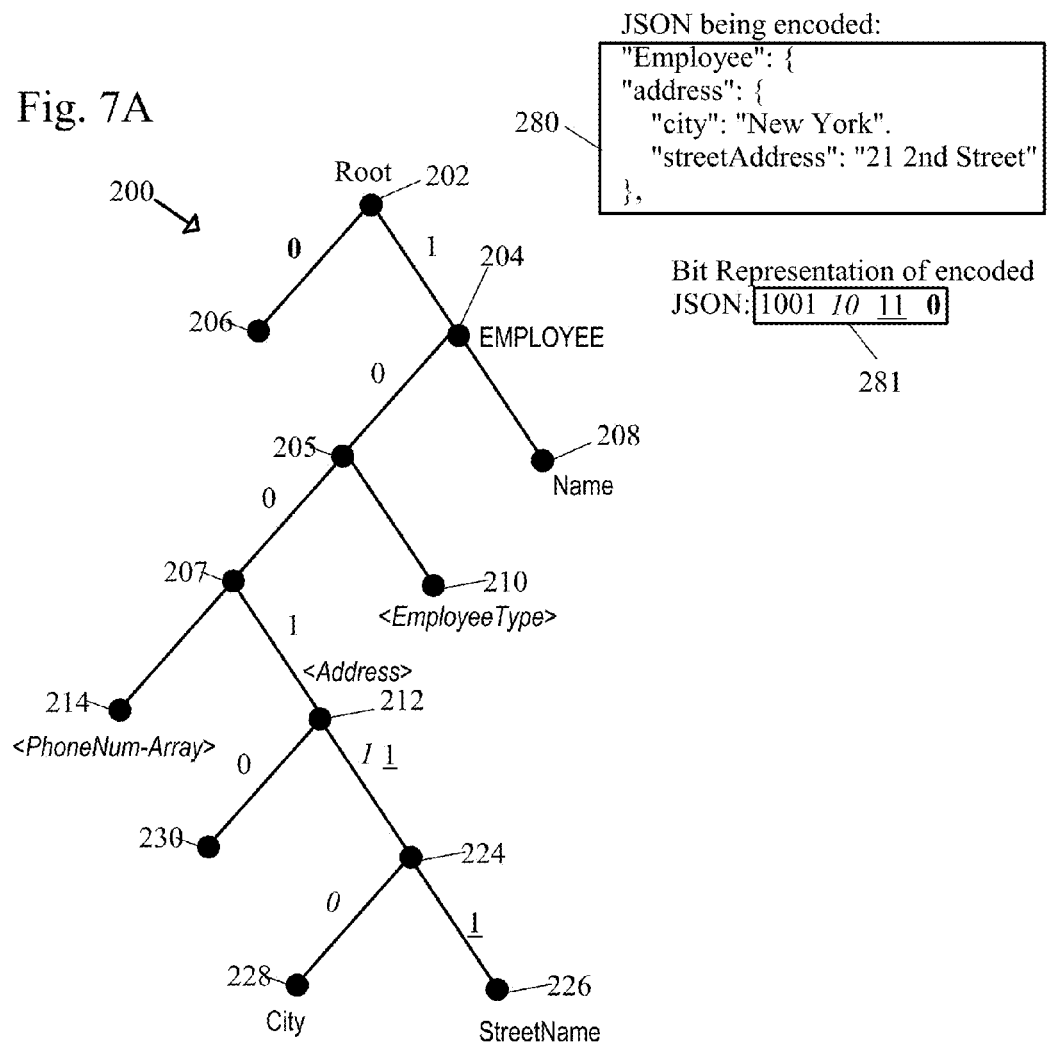

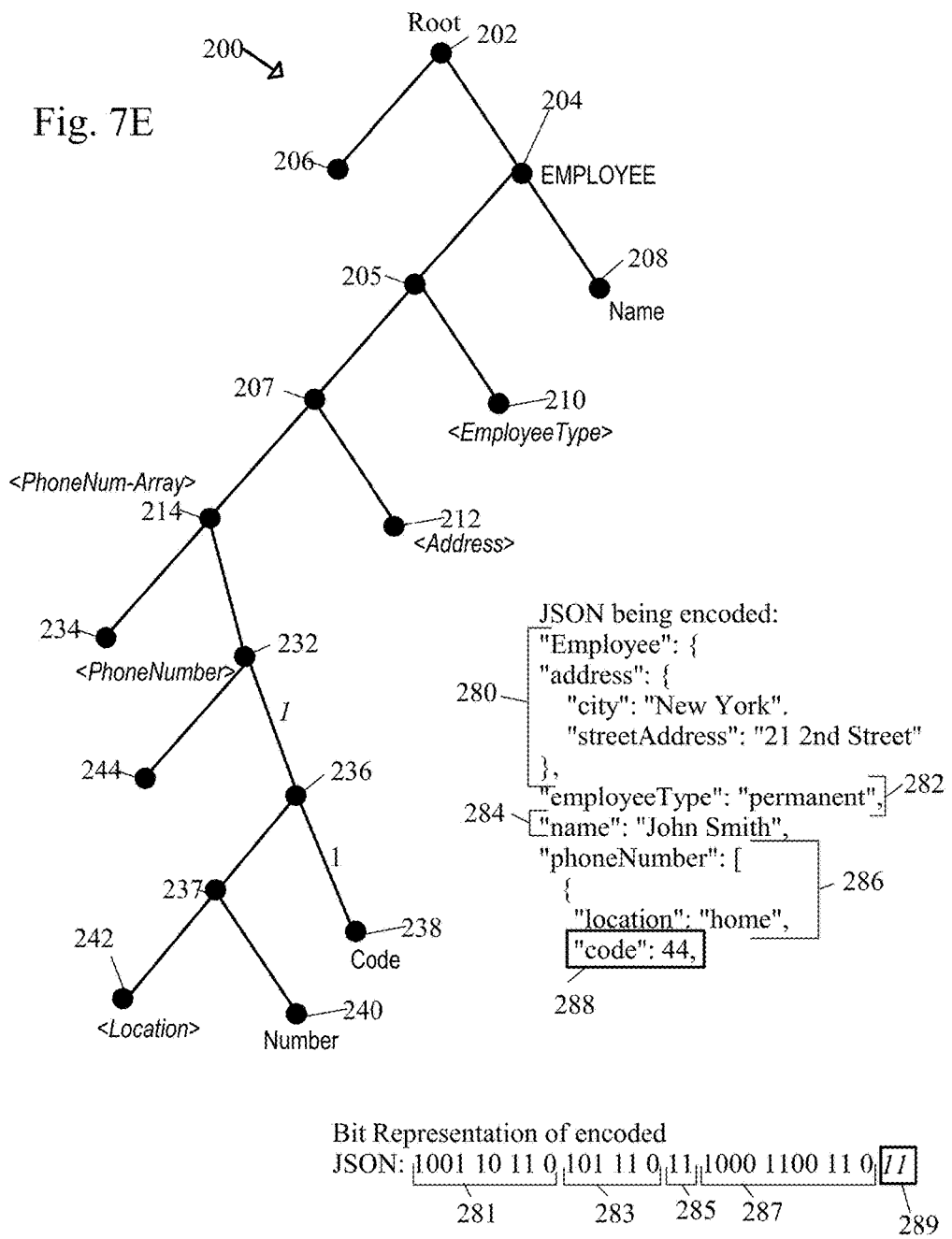

Bit Representation for decoding
JSON: 1001 10 11 0 101 11 0 11 1000 1100 11 0 11 101 0 1100 10 0 11 101 0 0 0

COMPRESSION OF JAVASCRIPT OBJECT NOTATION DATA USING STRUCTURE INFORMATION

BACKGROUND

The present invention relates to compression of JavaScript object notation (JSON) data, and more specifically to compression of JSON data using structure information.

JSON (JavaScript Object Notation) is an open standard format that uses human-readable text to transmit data objects consisting of attribute-value pairs. It is based on a subset of the JavaScript Programming Language.

JSON is a text format that is completely language independent but uses conventions that are familiar to programmers of the C-family of languages, including C, C++, C#, Java, JavaScript, Perl, Python, and many others.

JSON is built on two structures:
  A collection of name/value pairs. In various languages, this is realized as an object, record, struct, dictionary, hash table, keyed list, or associative array.
  An ordered list of values. In most languages, this is realized as an array, vector, list, or sequence.

A JSON Schema specifies a JSON-based format to define the structure of JSON data for validation, documentation, and interaction control. A JSON Schema provides a contract for the JSON data required by a given application, and how that data can be modified. The JSON Schema can be used to validate JSON data. The same serialization/deserialization tools can be used both for the schema and data. The schema is self-describing.

There has been an increase in representing data in JSON across different domains from databases to web applications due to the simplicity and ease of representing data. Client side programming models rely on JSON transport between client and server for client side display. However, JSON documents tend to be quite large compared to other forms of data representation.

The JSON documents are quite large due to the fact that data must be converted for text based encoding, over-usage of quotes, and when multiple objects are serialized in the same message, key names for each property must be repeated, even though they are the same for each object. Additionally, common values or properties are also serialized.

A prior art solution used to overcome the size of the JSON documents is to transpose the JSON data and group together all the values for each instance of the specific key and list them in an array. Another solution is to represent the JSON data in binary form.

The disadvantages of the above solutions are that the techniques do not use the inherently well-defined structure of the JSON document to provide optimal compression.

U.S. Pat. No. 7,886,223, assigned to International Business Machines Corporation, discusses using a statistical tree for encoding and decoding an extensible markup language (XML) document. XML represents the structure of data before it is transported from one system to another. The XML Schema used to create the statistical tree supports complex types which allow the creation of a compression tree to be created for each complex type. Each compression tree is then used to compress the XML fragments pertaining to it.

The JSON Schema introduces complexities to the tree which are not present or representable in an XML Schema. Furthermore, JSON data does not support complex types, which XML does. Instead, JSON documents support lists or arrays which would have to be dealt with differently.

SUMMARY

According to one embodiment of the present invention, a method for encoding a javascript object notation (JSON) document utilizing a statistical tree representing a JSON Schema is disclosed. The method comprising the steps of: a computer establishing a root node of the statistical tree; the computer sequentially selecting each of a plurality of fragments of the JSON document; the computer locating a genuine node having properties corresponding to the respective fragment in the statistical tree corresponding to each of the selected fragments; the computer determining a binary code representing a path of traversal through the statistical tree to the corresponding genuine node from the root node; the computer ordering the binary code in accordance with the sequence of the respective fragments in the JSON document; the computer analyzing each located genuine node to determine the type of node, with the determined type being utilized to establish a next genuine node for encoding the sequentially next fragment of the JSON document; and the computer optimizing the statistical tree to reduce a number of bits comprising the binary code representing elements, enumerations, and attributes of the JSON document.

An advantage of the method for encoding a JSON document is that the method uses the inherently well-defined structure of the JSON document, which utilizes a statistical tree representing a JSON Schema, so that the JSON document itself provides optimal compression of the data, decreasing the size of the JSON data. Additionally, by representing each path within the statistical tree by a single bit, the enumerated data of the JSON document structure may be compressed to a few bytes of data. Since the compression of the structure of the JSON data is independent of the compression used for the data, the compression achieved is high. Furthermore, the compression takes advantage of the fact that the same tree will be generated with a particular JSON Schema if the same rules are applied to an encoded, optimized tree during a decompression process.

According to one embodiment of the present invention, a method for decoding a JSON document represented by a binary encoded sequence is disclosed. The method comprising: a computer establishing a root node in a statistical tree representing a JSON Schema of the JSON document; the computer traversing the statistical tree from the designated root node to locate a next genuine node, the traversal based upon at least one portion of the binary encoded sequence bits; the computer generating a fragment of the JSON document, the fragment corresponding to the located genuine node; the computer ordering the generated fragments in accordance with the order of the corresponding bits in the binary sequence; the computer analyzing each located genuine node to determine the type of node, with the determined type being utilized to establish a next genuine node for decoding the sequentially next fragment of the JSON document; and the computer optimizing the statistical tree to reduce a number of bits comprising the binary code representing elements, enumerations, and attributes of the JSON document. Each genuine node is preferably analyzed to determine a type of the node, the type of node determining if a next genuine node is to be designated for traversing the statistical tree in according with the bits corresponding to the sequentially next at least one portion of the binary encoded sequence. An advantage of using the inherently well-defined structure of the JSON document, which utilizes a statistical tree representing a JSON Schema, provides optimal compression of the data, decreasing the size of the JSON data.

An advantage of the method for decoding a JSON document is that the method uses the inherently well-defined structure of the JSON document dictated by a statistical tree representing a JSON Schema, to generate the previously encoded JSON document.

According to one embodiment of the present invention, a computer program product for encoding a javascript object notation (JSON) document utilizing a statistical tree representing a JSON Schema with a computer is disclosed. The computer comprising at least one processor, one or more memories, one or more computer readable storage media, the computer program product comprising a computer readable storage medium having program instructions embodied therewith, the program instructions executable by the computer to perform a method. The method comprising: establishing, by the computer, a root node of the statistical tree; sequentially, by the computer, selecting each of a plurality of fragments of the JSON document; locating, by the computer, a genuine node having properties corresponding to the respective fragment in the statistical tree corresponding to each of the selected fragments; determining, by the computer, a binary code representing a path of traversal through the statistical tree to the corresponding genuine node from the root node; ordering, by the computer, the binary code in accordance with the sequence of the respective fragments in the JSON document; analyzing, by the computer, each located genuine node to determine the type of node, with the determined type being utilized to establish a next genuine node for encoding the sequentially next fragment of the JSON document; and optimizing, by the computer, the statistical tree to reduce a number of bits comprising the binary code representing elements, enumerations, and attributes of the JSON document. An advantage of using the inherently well-defined structure of the JSON document, which utilizes a statistical tree representing a JSON Schema, provides optimal compression of the data, decreasing the size of the JSON data.

An advantage of the computer program product for encoding a JSON document is that the computer program product uses the inherently well-defined structure of the JSON document, which utilizes a statistical tree representing a JSON Schema, so that the JSON document itself provides optimal compression of the data, decreasing the size of the JSON data. Additionally, by representing each path within the statistical tree by a single bit, the enumerated data of the JSON document structure may be compressed to a few bytes of data. Since the compression of the structure of the JSON data is independent of the compression used for the data, the compression achieved is high. Furthermore, the compression takes advantage of the fact that the same tree will be generated with a particular JSON Schema if the same rules are applied to an encoded, optimized tree during a decompression process.

According to one embodiment of the present invention, a computer program product for decoding a JSON document represented by a binary encoded sequence with a computer is disclosed. The computer comprising at least one processor, one or more memories, one or more computer readable storage media, the computer program product comprising a computer readable storage medium having program instructions embodied therewith, the program instructions executable by the computer to perform a method. The method comprising: establishing, by the computer, a root node in a statistical tree representing a JSON Schema of the JSON document; traversing, by the computer, the statistical tree from the designated root node to locate a next genuine node, the traversal based upon at least one portion of the binary encoded sequence bits; generating, by the computer, a fragment of the JSON document, the fragment corresponding to the located genuine node; ordering, by the computer, the generated fragments in accordance with the order of the corresponding bits in the binary sequence; analyzing, by the computer, each located genuine node to determine the type of node, with the determined type being utilized to establish a next genuine node for decoding the sequentially next fragment of the JSON document; and optimizing, by the computer, the statistical tree to reduce a number of bits comprising the binary code representing elements, enumerations, and attributes of the JSON document. Each genuine node preferably being analyzed by the computer to determine a type of the node, the type of node determining if a next genuine node is to be designated for traversing the statistical tree in according with the bits corresponding to the sequentially next at least one portion of the binary encoded sequence. An advantage of using the inherently well-defined structure of the JSON document, which utilizes a statistical tree representing a JSON Schema, provides optimal compression of the data, decreasing the size of the JSON data.

An advantage of the computer program product for decoding a JSON document is that the method uses the inherently well-defined structure of the JSON document dictated by a statistical tree representing a JSON Schema, to generate the previously encoded JSON document.

According to one embodiment of the present invention, a computer system for encoding a javascript object notation (JSON) document utilizing a statistical tree representing a JSON Schema comprising a computer comprising at least one processor, one or more memories, one or more computer readable storage media having program instructions executable by the computer to perform the program instructions is disclosed. The program instructions comprising: establishing, by the computer, a root node of the statistical tree; sequentially, by the computer, selecting each of a plurality of fragments of the JSON document; locating, by the computer, a genuine node having properties corresponding to the respective fragment in the statistical tree corresponding to each of the selected fragments; determining, by the computer, a binary code representing a path of traversal through the statistical tree to the corresponding genuine node from the root node; ordering, by the computer, the binary code in accordance with the sequence of the respective fragments in the JSON document; analyzing, by the computer, each located genuine node to determine the type of node, with the determined type being utilized to establish a next genuine node for encoding the sequentially next fragment of the JSON document; and optimizing, by the computer, the statistical tree to reduce a number of bits comprising the binary code representing elements, enumerations, and attributes of the JSON document.

An advantage of the computer system for encoding a JSON document is that the computer system uses the inherently well-defined structure of the JSON document, which utilizes a statistical tree representing a JSON Schema, so that the JSON document itself provides optimal compression of the data, decreasing the size of the JSON data. Additionally, by representing each path within the statistical tree by a single bit, the enumerated data of the JSON document structure may be compressed to a few bytes of data. Since the compression of the structure of the JSON data is independent of the compression used for the data, the compression achieved is high. Furthermore, the compression takes advantage of the fact that the same tree will be generated with a particular JSON Schema if the same rules are applied to an encoded, optimized tree during a decompression process.

According to one embodiment of the present invention, a computer system for decoding a JSON document represented by a binary encoded sequence comprising a computer comprising at least one processor, one or more memories, one or more computer readable storage media having program instructions executable by the computer to perform the program instructions is disclosed. The program instructions comprising: establishing, by the computer, a root node in a statistical tree representing a JSON Schema of the JSON document; traversing, by the computer, the statistical tree from the designated root node to locate a next genuine node, the traversal based upon at least one portion of the binary encoded sequence bits; generating, by the computer, a fragment of the JSON document, the fragment corresponding to the located genuine node; ordering, by the computer, the generated fragments in accordance with the order of the corresponding bits in the binary sequence; analyzing, by the computer, each located genuine node to determine the type of node, with the determined type being utilized to establish a next genuine node for decoding the sequentially next fragment of the JSON document; and optimizing, by the computer, the statistical tree to reduce a number of bits comprising the binary code representing elements, enumerations, and attributes of the JSON document. Each genuine node preferably being analyzed by the computer to determine a type of the node, the type of node determining if a next genuine node is to be designated for traversing the statistical tree in according with the bits corresponding to the sequentially next at least one portion of the binary encoded sequence.

An advantage of the computer system for decoding a JSON document is that the method uses the inherently well-defined structure of the JSON document dictated by a statistical tree representing a JSON Schema, to generate the previously encoded JSON document.

BRIEF DESCRIPTION OF THE DRAWINGS

FIGS. 4A-4C show a flow diagram of a method of encoding JSON from a tree for compression, in accordance with an embodiment of the present invention.

FIG. 7A shows a diagram illustrating traversal of a statistical tree for encoding a portion of a JSON document shown in Table 1.

FIG. 7E shows a diagram illustrating traversal of a statistical tree for encoding a portion of a JSON document shown in Table 1.

DETAILED DESCRIPTION

It will be recognized that in an embodiment of the present invention, compression of JSON data in an embodiment of the present invention uses the JSON Schema or other schema to create a path based statistical tree built on a certain set of rules and using this tree to encode the JSON body and the enumerated data in a JSON document. A single JSON Schema may be common across multiple JSON documents and may be utilized to encode JSON documents whose structure adheres to the same JSON Schema. The compression takes advantage of the fact that the same tree will be generated with a particular JSON Schema if the same rules are applied to an encoded, optimized tree during a decompression process.

It will be recognized that in an embodiment of the present invention, each path within the tree is represented by a single bit, which aids in representing the whole JSON document structure in as little as a few bytes of data. The only data which is not considered during the compression process of an embodiment of the present invention is data that is defined by the user, e.g. non-enumerated data which can be compressed using conventional text-based compression techniques.

It will also be recognized that an optimization of the path based tree is carried out at run-time based on the occurrences of the different nodes, attributes, and enumerated values that would aid in obtaining a higher compression ratio than if statistical JSON encoding was used.

It will be recognized that in an embodiment of the present invention, the compression of the structure of the JSON data is independent of the compression used for the data and the compression achieved is high. If the JSON document contains only enumerated data, then a separate compression process for the JSON data is not required since this compression compresses that data. If the JSON document contains only free form data, the compression ratio using the compression of an embodiment of the present invention is approximately 0. If the JSON document contains 20% of enumerated data, the compression ratio is approximately 80%.

By ensuring that the encoding of the structured content of the JSON document is independent from the storage of the non-enumerated data, performing various operations on the encoded document, such as querying of the partially compressed data is also possible in an embodiment of the present invention, prior to the data undergoing compression through text compression. Decoding the encoded document requires traversing the statistical tree in accordance with the encoded binary sequence and retrieving stored, uncompressed data.

Figure 1:
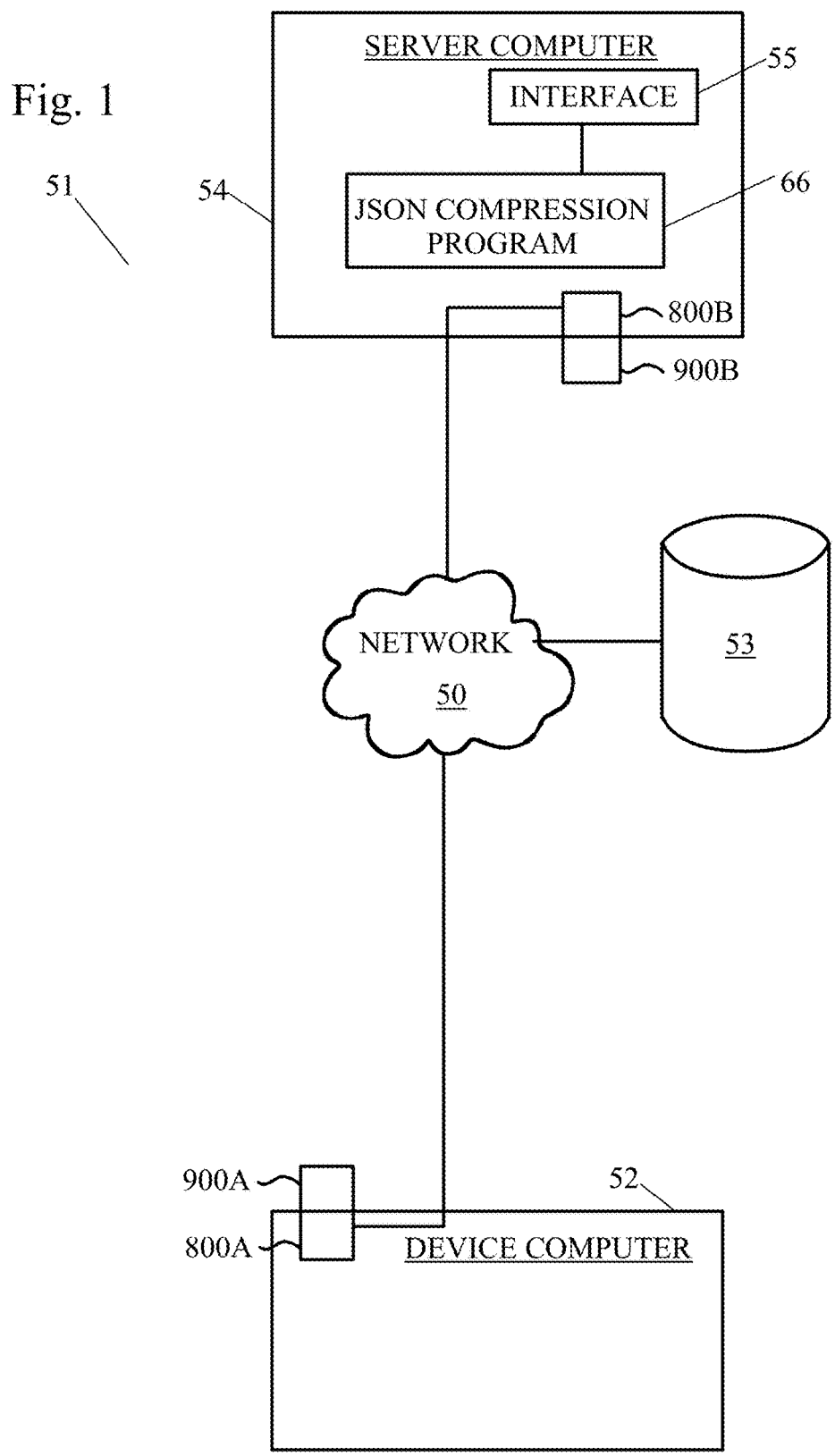
FIG. 1 depicts an exemplary diagram of a possible data processing environment in which illustrative embodiments may be implemented.

FIG. 1 is an exemplary diagram of a possible data processing environment provided in which illustrative embodiments may be implemented. It should be appreciated that FIG. 1 is only exemplary and is not intended to assert or imply any limitation with regard to the environments in which different embodiments may be implemented. Many modifications to the depicted environments may be made.

Referring to FIG. 1, network data processing system 51 is a network of computers in which illustrative embodiments may be implemented. Network data processing system 51 contains network 50, which is the medium used to provide communication links between various devices and computers connected together within network data processing system 51. Network 50 may include connections, such as wire, wireless communication links, or fiber optic cables.

In the depicted example, device computer 52, storage unit 53, and server computer 54 connect to network 50. In other exemplary embodiments, network data processing system 51 may include additional client computers, storage devices, server computers, and other devices not shown.

Figure 9:
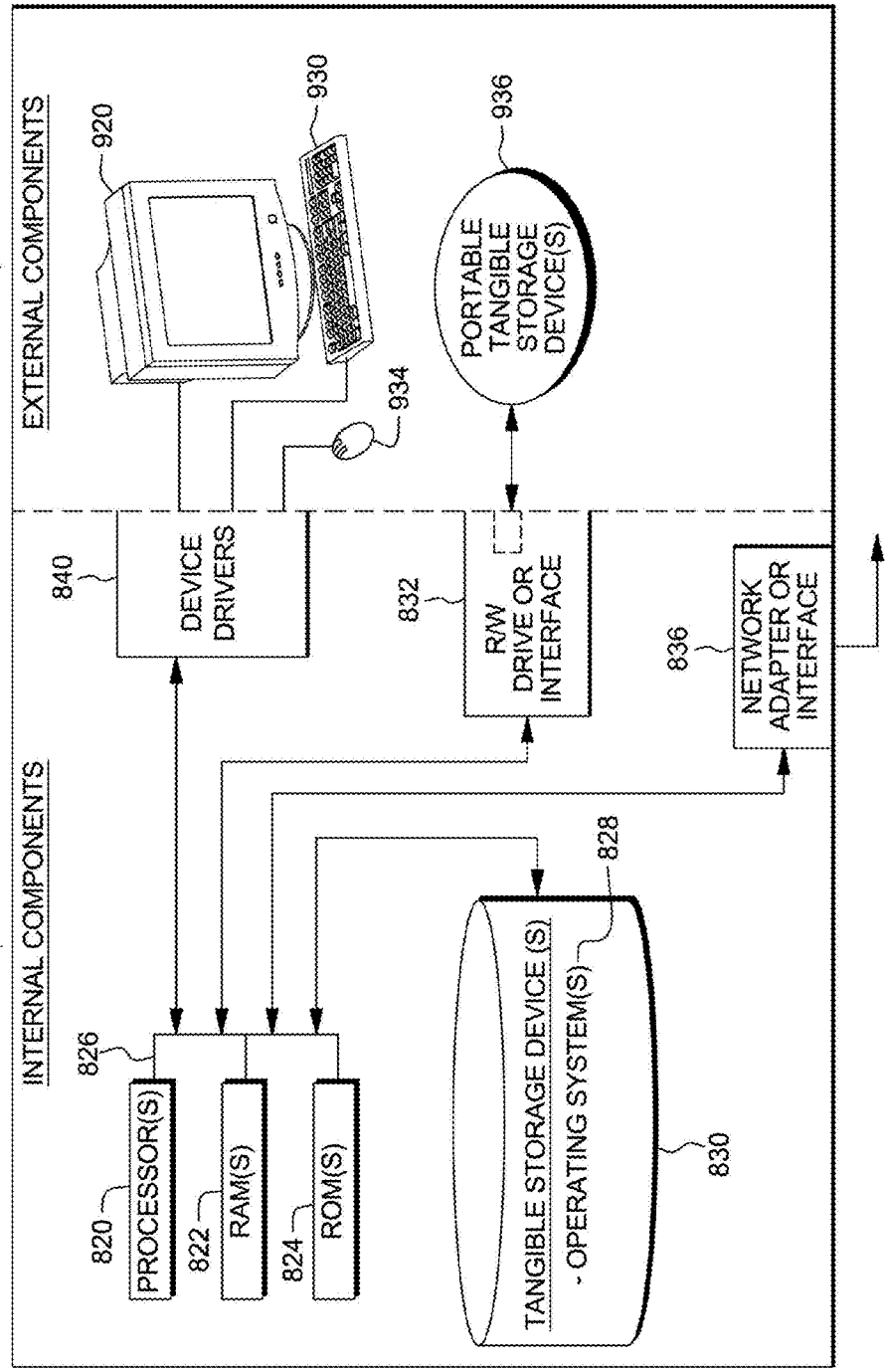
FIG. 9 illustrates internal and external components of a client or device computer and a server computer in which illustrative embodiments may be implemented.

Device computer 52 includes a set of internal components 800a and a set of external components 900a, further illustrated in FIG. 9. Device computer 52 may be, for example, a mobile device, a cell phone, a personal digital assistant, a netbook, a laptop computer, a tablet computer, a desktop computer, or any other type of computing device. Device computer 52 may contain an interface. The interface may accept commands and data entry from a user. The interface can be, for example, a command line interface, a graphical user interface (GUI), or a web user interface (WUI) through which a user can access JSON data and/or JSON documents on a server computer 54.

Server computer 54 includes a set of internal components 800b and a set of external components 900b illustrated in FIG. 9. In the depicted example, server computer 54 provides information, such as boot files, operating system images, and applications to device computer 52. Server computer 54 can compute the information locally or extract the information from other computers on network 50. The server computer preferably includes a JSON compression program 66. The server computer 54 may contain an interface 55. Through interface 55, users may view rules for compression of the JSON data, a JSON Schema, uncompressed JSON data, the compressed structured JSON data, structured JSON data, unstructured JSON data, and the compressed JSON data. Additionally, through interface 55, any representation, for example trees, of the compressed JSON data may be displayed. Interface 55 may accept commands and data entry from a user, such as JSON data, JSON Schema, queries, or compression rules. Interface 55 can be, for example, a command line interface, a graphical user interface (GUI), or a web user interface (WUI) through which a user can access the JSON compression program 66 on a server computer 54, as shown in FIG. 1, or alternatively on device computer 52.

Program code, JSON compression rules, JSON Schema, uncompressed JSON data, the compressed structured JSON data, structured JSON data, unstructured JSON data, the compressed JSON data, and programs such as JSON compression program 66 may be stored on at least one of one or more computer-readable tangible storage devices 830 shown in FIG. 9, on at least one of one or more portable computer-readable tangible storage devices 936 as shown in FIG. 9, or on storage unit 53 connected to network 50, or may be downloaded to a computer, such as device computer 52 or server computer 54, for use. For example, program code, JSON compression rules, JSON Schema, uncompressed JSON data, the compressed structured JSON data, structured JSON data, unstructured JSON data, the compressed JSON data, and programs such as JSON compression program 66 may be stored on at least one of one or more storage devices 830 on server computer 54 and downloaded to device computer 52 over network 50 for use on device computer 52.

Alternatively, server computer 54 can be a web server, and the program code, JSON compression rules, JSON Schema, uncompressed JSON data, the compressed structured JSON data, structured JSON data, unstructured JSON data, the compressed JSON data, and programs such as JSON compression program 66 may be stored on at least one of the one or more storage devices 830 on server computer 54 and accessed on device computer 52. In other exemplary embodiments, the program code, JSON compression rules, JSON Schema, uncompressed JSON data, the compressed structured JSON data, structured JSON data, unstructured JSON data, the compressed JSON data, and programs such as JSON compression program 66 may be stored on at least one of one or more computer-readable storage devices 830 on device computer 52 or distributed between two or more servers.

In the depicted example, network data processing system 51 is the Internet with network 50 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 51 also may be implemented as a number of different types of networks, such as, for example, an intranet, local area network (LAN), or a wide area network (WAN). FIG. 1 is intended as an example, and not as an architectural limitation, for the different illustrative embodiments. It should be noted that the JSON compression program 66 may execute both compression and decompression of the JSON documents.

A statistical tree can be generated using the JSON document during the encoding and decoding of any JSON document, which has structural content complying with the JSON Schema. The JSON Schema expresses shared vocabularies and defines the structure, content and semantics of a JSON document which utilizes that particular JSON Schema. A statistical tree, created during the encoding of a JSON document, captures the information defined by the JSON Schema by representing the elements, attributes and enumerations as branches, nodes and leaves of a statistical tree. The elements, attributes and enumerations of a JSON Schema or corresponding JSON document may be referred to as the components of the JSON Schema. Traversing the paths between nodes of a statistical tree can be represented by binary sequences, which therefore can be interpreted to describe the structure of the JSON Schema.

As will be described, during encoding and decoding of a JSON document, the statistical tree, representing the JSON Schema of the corresponding JSON document, is traversed. If, during this traversal, a leaf node in the tree is encountered, an instance of a corresponding type tree is merged with that leaf node, wherein the corresponding type tree is dependent upon the JSON component represented by the leaf node.

The generation of statistical type trees according to an embodiment of the present invention requires the prioritization of components identified in the JSON Schema. The prioritization is performed according to a predefined set of rules. The rules which are utilized may be based upon criteria such as the probability of occurrence of a component (i.e. based upon the minimum and/or maximum number of occurrence attributes defined in the JSON Schema), or even the number of characters representing the component name. Preferably, the criteria applied should be applicable to all components. The rules should be defined so that the number of bits required to represent the most common elements, enumerations and attributes, during encoding, are minimized.

According to one implementation, the rules for generating a statistical tree are:
1) All components in the JSON Schema are assigned a priority based upon the number of times they can occur in the JSON document. The lesser the number of possible occurrences, the higher the priority. Fields marked as required receive a higher priority. Simple type fields receive a higher priority that complex type fields.
2) Attributes with enumerations have a higher priority over other elements.
3) If multiple components are assigned the same priority level according to the above rules 1-2, then these components are further prioritized according to the minimum number of occurrences of each component. A higher minimum occurrence will be assigned a higher priority level.
4) If multiple components are assigned the same priority level after applying rules 1-3, then the priority of these components are assigned based on the increasing length of name of the JSON component. Longer names will be assigned a higher priority.

Furthermore, in complex type fields, enumeration receives a higher priority than other complex type fields. It should also be noted that values of each JSON field are represented in the leaf nodes of all statistical trees.

Figure 2:
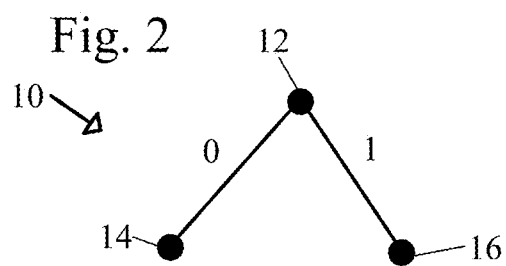
FIG. 2 shows a diagram of a statistical tree.

FIG. 2 is a tree diagram 10 comprising a single parent node 12, and a pair of child nodes 14, 16. The left and right child nodes 14, 16 may be referred to as "peer" nodes of one another.

The path from the parent node 12 to the child node 14 or 16, along the tree branch 10, may be assigned a binary '0' or '1' as illustrated. The designation of the binary representation along the paths from the parent node 12 to the child nodes 14, 16 is arbitrary, and may be interchanged, provided that the designation is applied consistently throughout the generation of the statistical type trees for encoding and decoding. Hereafter, it will be assumed that the designation applied in FIG. 2 is adhered to. Therefore, all references to traversing from a parent node to a child node along a path represented by a '0' will indicate following the path to the 'left' peer child node. Similarly, traversing from a parent node to a child node along a path represented by a '1' indicates following the path to the 'right' peer child node.

In the present disclosure, any node of a statistical type tree that represents a JSON element, attribute or enumeration is known as a "genuine" node.

Figure 3:
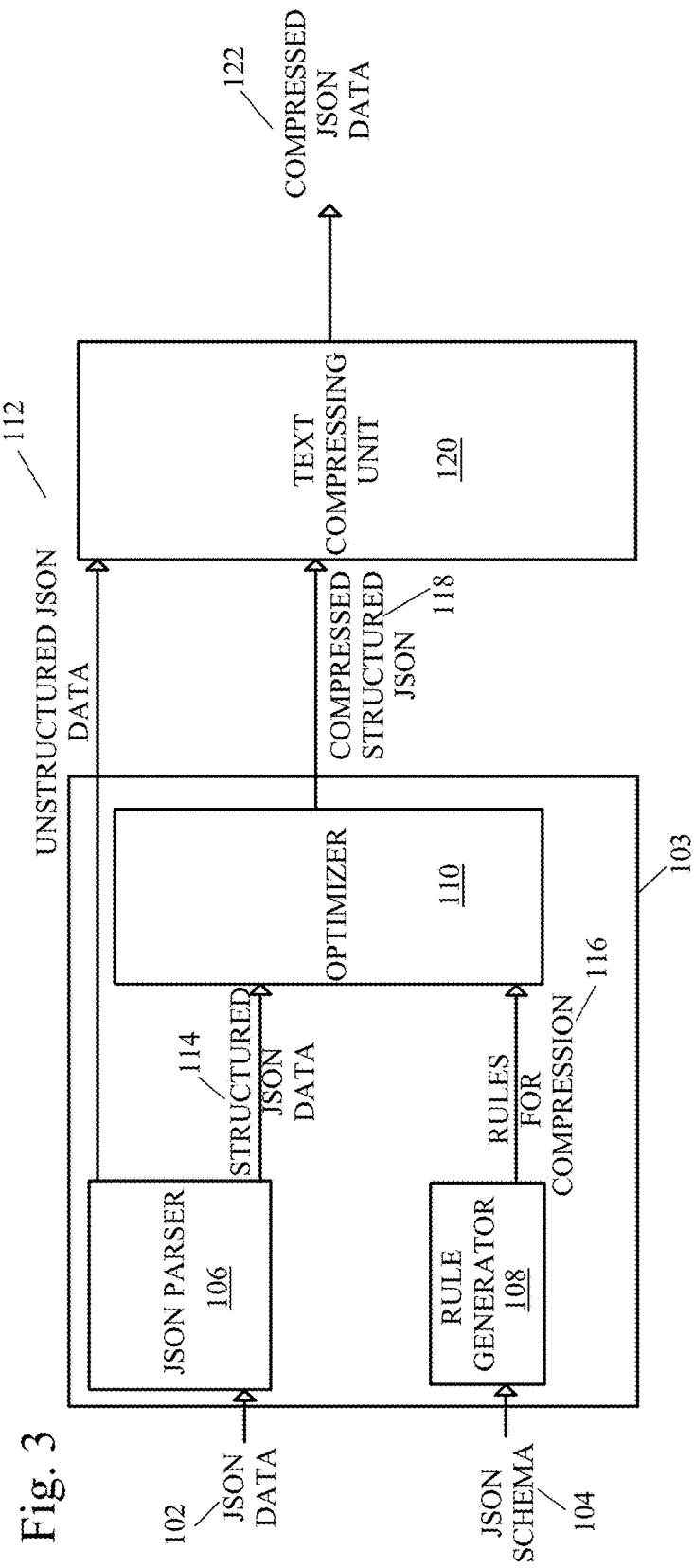
FIG. 3 is a block schematic diagram of a system for generating a statistical tree and encoding an JSON document using the same, in accordance with an embodiment of the present invention.

FIG. 3 shows a schematic of the basic architecture of a system using a structure compression algorithm of an embodiment of the present invention. The architecture may be present on the server computer 54 of FIG. 1.

A structure compression module 103 receives input of JSON data 102 from a JSON document and JSON Schema 104. Within the structure compression module 103 is a JSON parser module 106, a rule generator module 108, and an optimizer module 110. The rule generator module 108 receives the JSON Schema 104 and processes the JSON Schema 104 to generate a set of rules for compression 116. The rules for compression 116 are provided as input to the optimizer module 110.

The JSON parser module 106 receives JSON data 102 and parses the data to output unstructured JSON data 112 and structured JSON data 114. The unstructured JSON data 112 is provided as input to a text compressing unit 120. The structured JSON data 114 is provided as input to the optimizer module 110.

The optimizer module 110 uses the rules for compression 116 from the rule generator module 108 to compress the structured JSON data 114 from the JSON parser module 106 and outputs a compressed structured JSON data 118 which includes enumerated data. The compressed structured JSON data 118 is provided as input to the text compressing unit 120. The compressed structured JSON data 118 may be used to compress the data even further with the text compressing unit 120, resulting in compressed JSON data 122.

An example of a sample JSON Schema is shown in Table 2 below.

The optimizer module 110 uses tree models to represent the element, attributes and enumerations in a JSON Schema which are utilized when encoding an JSON document which conforms with the same JSON Schema. The trees are generated using the rules provided by the rule generator module 108, based on the JSON Schema 104. The process of encoding involves traversing the statistical tree with reference to the JSON document being encoded, and representing each of the attributes, elements and enumerated data appearing in the JSON document with a binary representation of the paths traversed through the statistical tree to reach the nodes corresponding to the attribute, element or enumeration fragment being encoded. A set of optimizations, by the optimizer module 110, is performed on the tree based on the current occurrences and possible number of occurrences using the rules discussed above, while building the trees.

Figure 4B:
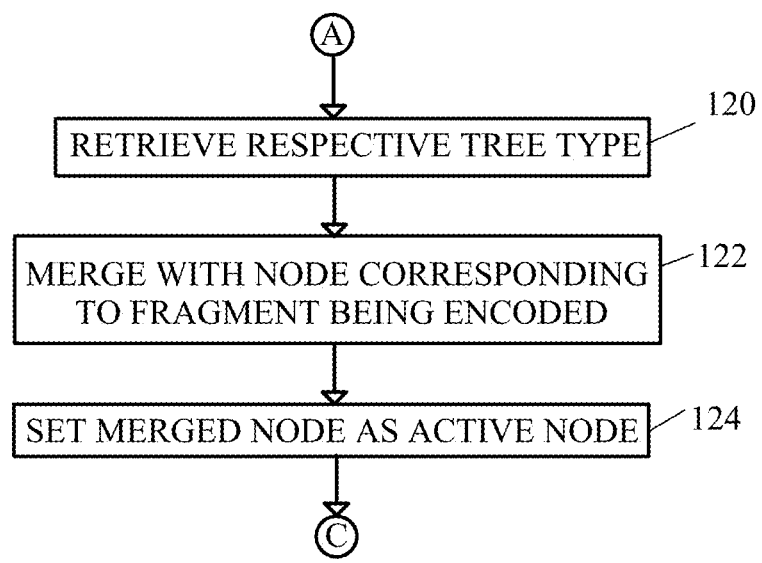
Figure 4C:
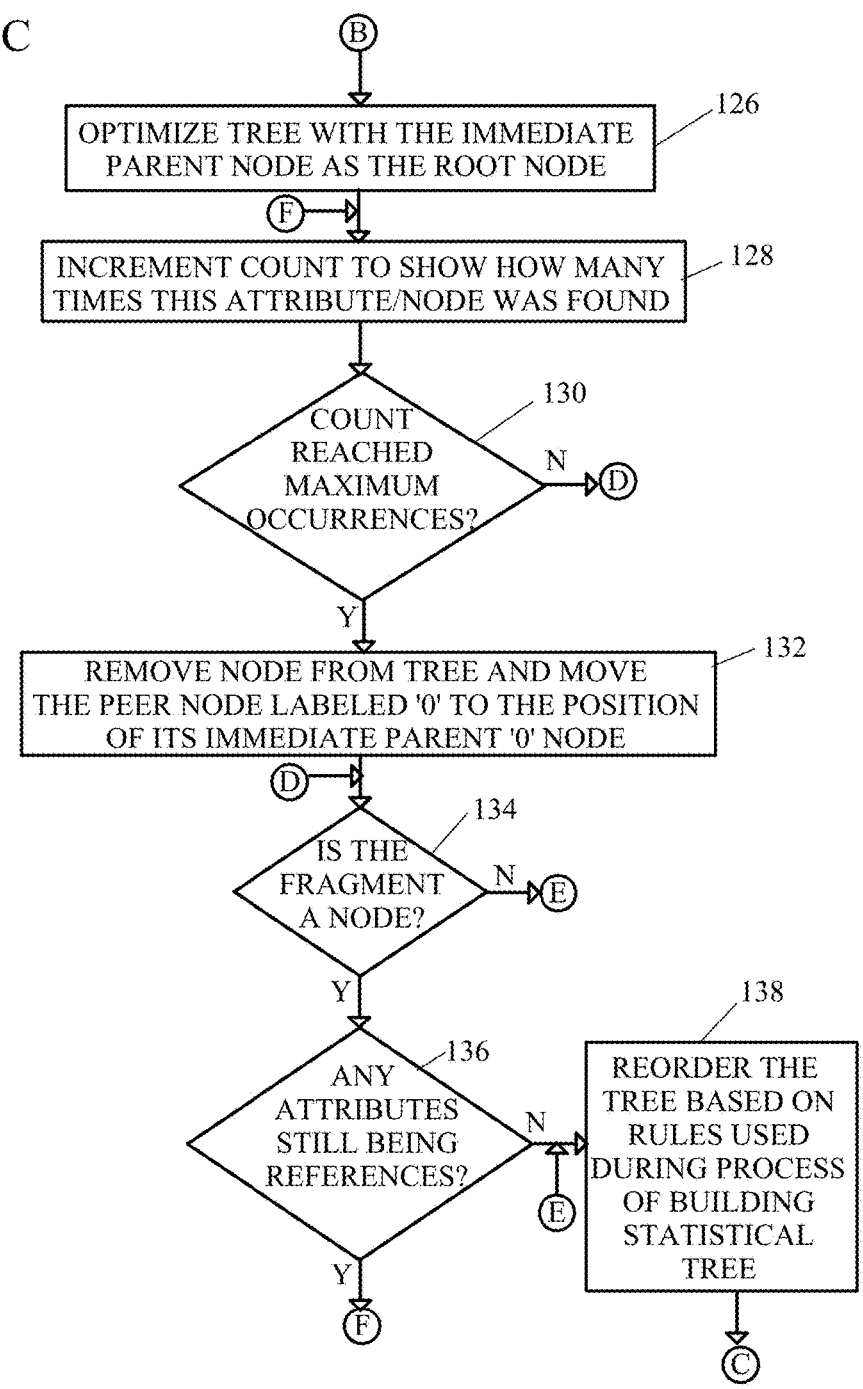

FIGS. 4A-4C is a flow diagram illustrating the process of encoding an JSON document using a tree model to process JSON data and compress said data. Each traversal begins at the node of the tree labeled "Schema", which is set as the root element (Step 102), for example by the JSON compression program 66.

The JSON document to be encoded may be considered as comprising a number of 'fragments', with each fragment being an instance of an element, attribute or enumerated data. The JSON document is analyzed to determine if there are remaining fragments which require encoding (Step 104).

If there is at least one remaining JSON fragment of the JSON document to be encoded, that next one fragment is selected (Step 106). The statistical tree is searched to find the node corresponding to the selected fragment (Step 108).

Once the corresponding node has been found, the binary sequence representing the traversal is determined, being the sequence from the corresponding node's genuine parent node to the corresponding node (Step 110). This sequence is then appended to any preceding binary encoded sequence (Step 112). If there is no preceding sequence, a new sequence is commenced.

As each node is allocated the properties of the element, attribute or enumerated data to which that node corresponds, the type information, including if it is a predefined type, can be determined by analyzing the node (Step 116).

If the node is not of a predefined type, then the type of the node is determined, and an instance of the respective type tree is retrieved (Step 120). The retrieved type tree is then merged with the node corresponding to the node for the JSON fragment presently being encoded (Step 122). The merged node of the retrieved type tree is then set as the active node (Step 124). The method returns to step 104 to determine whether there are remaining JSON fragments which need to be encoded. The preceding steps 104-124 may then be repeated recursively for each subsequent fragment of the JSON document to be encoded.

When an end tag of an element, attribute or enumeration is detected in the JSON document, the traversal resets to the genuine parent node of the root node by traversing, for example in the preferred binary representation, the 'all zero' path, being the path from a root node to a leaf node via a path represented only by binary '0's. Once the encoding reaches the end of the JSON document, and it is determined (at Step 104) that there is no further fragments to be encoded (i.e. the end tag corresponding to the Schema root node is detected), then the encoding is complete and the method ends.

If the node is of a predefined type, the associated data is retrieved and sent for processing (Step 118). The tree is optimized and sets the immediate parent node as the root node (Step 126), creating a sub-tree from the newly set root node. From the newly set root node, a count of how many times an attribute or node was found is incremented (Step 128). If the count has reached a maximum number of occurrences (Step 130) based on the JSON Schema, the node is removed from the sub-tree and a peer node labeled '0' is moved to the position of its immediate parent '0' node (Step 132). If the node represents a fragment (Step 134), and there are still attributes being references by the node (Step 136), the method returns to Step 128 to remove these attributes.

If the count has not reached a maximum number of occurrences (Step 130), the method continues to step 134.

If the node represents a fragment (Step 134) and no attributes are still being referenced by the node (Step 136), the sub-tree is reordered based on the rules used during the process of building the trees as discussed and the method returns to Step 104.

The rules may be as follows:
1) All components in the JSON Schema are assigned a priority based upon the number of times they can occur in the JSON document. The lesser the number of possible occurrences, the higher the priority. Fields marked as required receive a higher priority. Simple type fields receive a higher priority that complex type fields.
2) Attributes with enumerations have a higher priority over other elements.
3) If multiple components are assigned the same priority level according to the above rules 1-2, then these components are further prioritized according to the minimum number of occurrences of each component. A higher minimum occurrence will be assigned a higher priority level.
4) If multiple components are assigned the same priority level after applying rules 1-3, then the priority of these components are assigned based on the increasing length of name of the JSON component. Longer names will be assigned a higher priority.

If the node does not represent a fragment (Step 134) or if the node does represent a fragment (Step 134) and attributes are still not being referenced (Step 136), the sub-tree is reordered based on the rules used during the process of building the trees as discussed above and the method returns to Step 104.

The statistical trees and binary representation of the encoded JSON document as created from the method of FIGS. 4A-4C are utilized for the process of decoding.

Decoding involves traversing the statistical tree in accordance with the sequence of bits in the encoded binary sequence, and generating the corresponding elements, attributes and enumerated data fragments to produce the decoded JSON document structure. The structure and data retrieved from storage, when combined, produce the decoded JSON document.

Figure 5A:
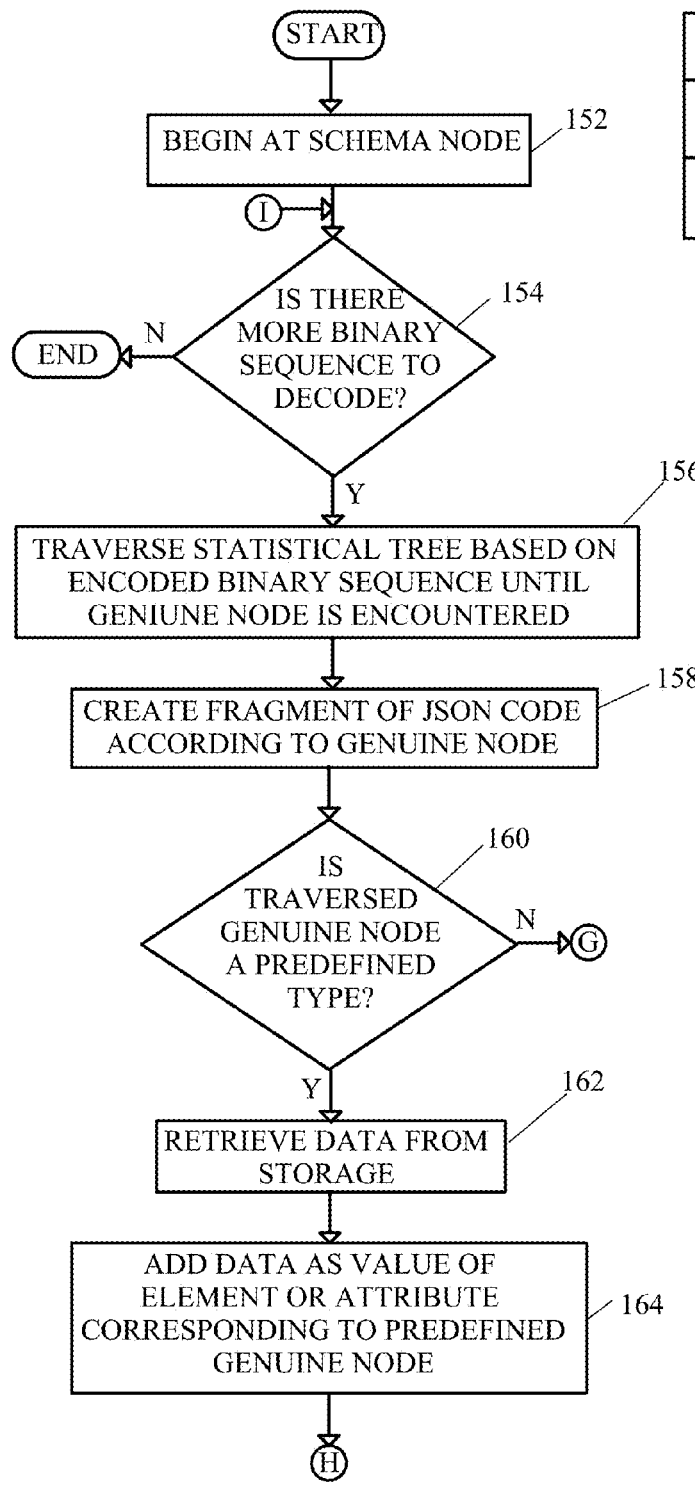
FIGS. 5A-5C show a flow diagram of a method of decoding JSON from a tree for decompression, in accordance with an embodiment of the present invention.
Figure 5B:
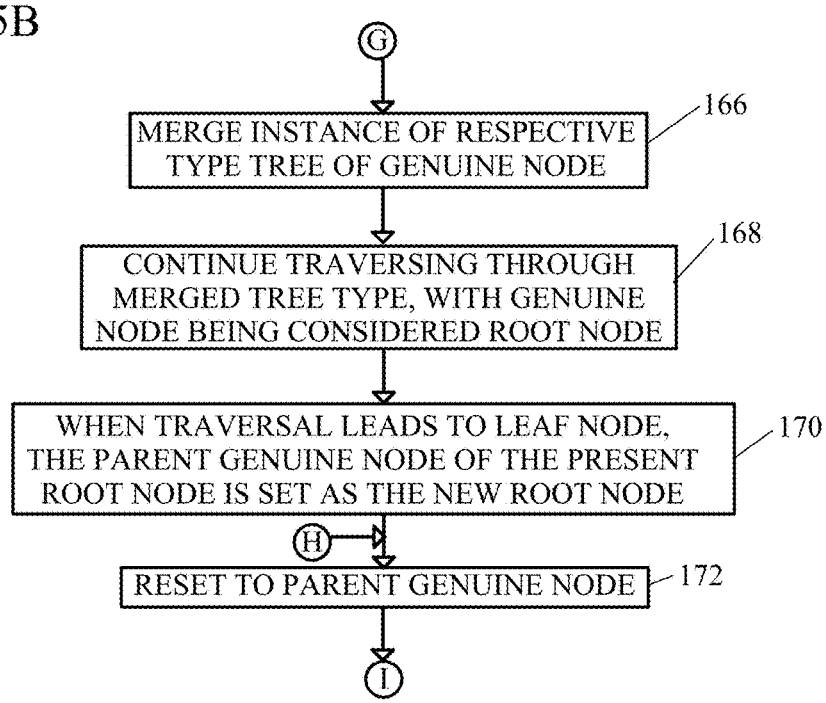
Figure 5C:
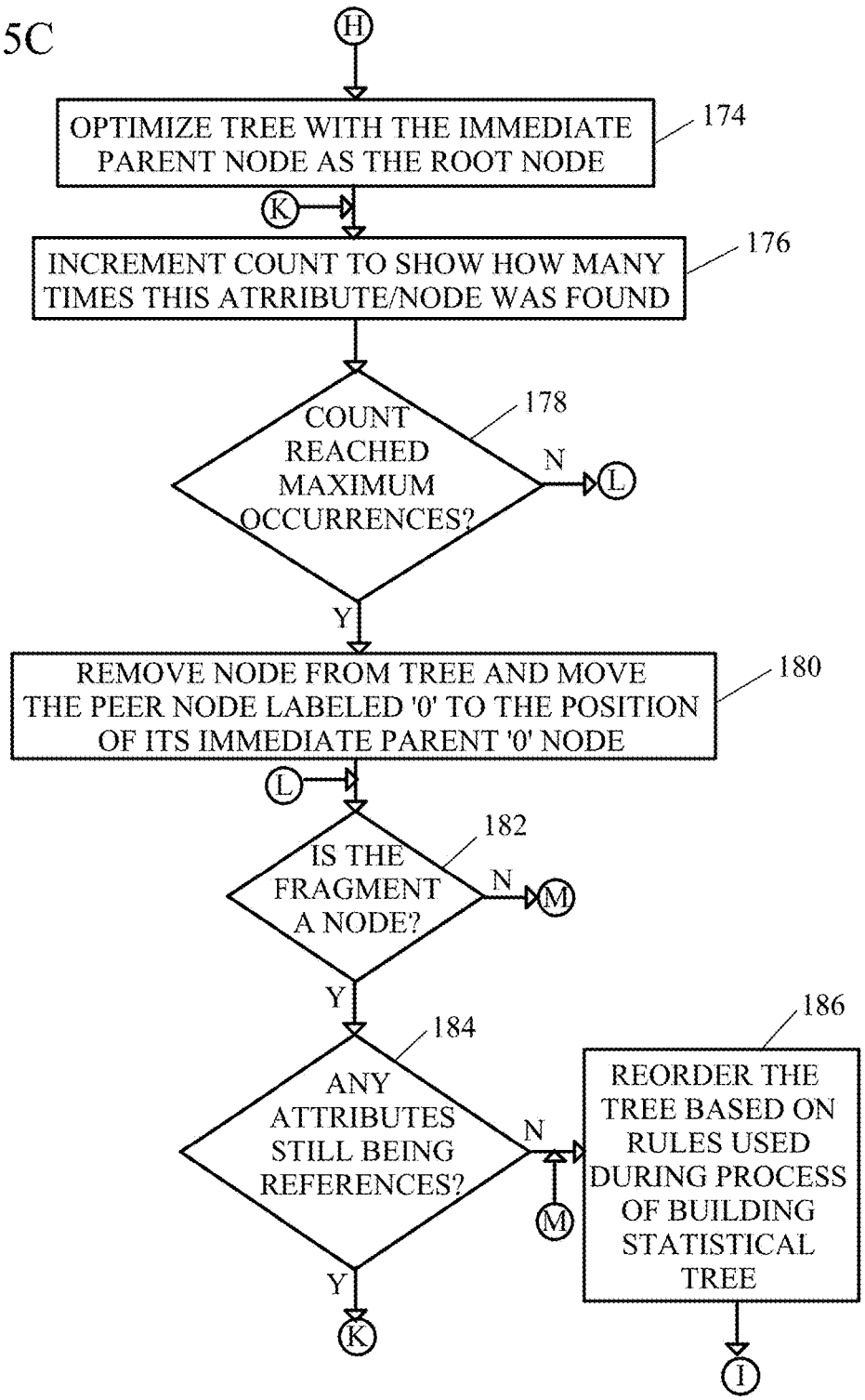

FIGS. 5A-5C are a flow diagram of a method for decoding the binary sequence representing an encoded JSON document, such as a document produced according to the method steps illustrated in FIGS. 4A-4C. The decoding process requires the use of the statistical tree which was utilized to perform the corresponding encoding.

The decoding traversal of the statistical tree begins at the root node "Schema" (Step 152).

The encoded binary sequence is checked to determine if there is remaining data to be decoded (Step 154).

If no further decoding is to be performed (step 154), the method ends.

If there is further decoding to be performed, the paths of the statistical tree are traversed based upon the encoded binary sequence until a genuine node is encountered (Step 156).

A fragment of JSON document is then generated, being a fragment corresponding to the element, attribute or enumeration assigned to the genuine node, and having properties matching those attributed to the genuine node (Step 158).

The type of the genuine node is then analyzed to determine if the traversed genuine node is a predefined type (Step 160).

If the node is of a predefined type, the data is retrieved from the storage and added to the JSON document as the value of an element or attribute (Step 162), or if the predefined type refers to a value, the value is added as a text value in the JSON document (Step 164).

The traversal then resets to the parent genuine node (Step 172), and the decoding continues from Step 154.

If, on the other hand, at Step 160, it is determined that the traversed genuine node is not a predefined type, then the type of the node is ascertained from the allocated node properties, and an instance of the respective type tree is merged with the genuine node (Step 166).

The genuine node is set as the root node, and the traversal of the type tree based on the subsequent binary encoded sequence continues (Step 168).

When the traversal leads to a leaf node the traversal resets the parent genuine node of the present root node as the new root node (Step 170).

If the path of traversal leads to a leaf node, the parent genuine node of the present root node is set as the new root node (Step 172). In other words, if the path of traversal leads to a leaf node whose path from the root node is represented by '0's only, then the traversal resets to the parent genuine node of the root node, and the parent genuine node is set as the new root node.

The tree is then optimized and sets the immediate parent node as the root node (Step 174), creating a sub-tree from the newly set root node. From the newly set root node, a count of how many times an attribute or node was found is incremented (Step 176).

If the count has not reached a maximum number of occurrences (Step 178), the methods continues to Step 182 discussed below.

If the count has reached a maximum number of occurrences (Step 178), the node is removed from the sub-tree and a peer node labeled '0' is moved to the position of its immediate parent '0' node (Step 180).

If the node represents a fragment (Step 182), and there are still attributes being references by the node, the method returns to Step 176 to remove these attributes. It should be noted that the statistical tree is optimized to ensure that same sequence of bits results in the same JSON data.

If the node represents a fragment (Step 182) and no attributes are still be references by the node (Step 184), the sub-tree is reordered based on the rules used during the process of building the trees as discussed and the method returns to Step 154.

The rules may be the same as set forth in the description of FIGS. 4A-4C, above.

If the node does not represent a fragment (Step 182) or if the node does represent a fragment (Step 182) and attributes are not still being referenced (Step 184), the sub-tree is reordered based on the rules used during the process of building the trees as discussed above and the method returns to Step 154.

An example of an employee record represented in JSON is shown below in Table 1.

TABLE 1

```
"Employee": {
    "address": {
        "city": "New York",
        "streetAddress": "21 2nd Street",
    },
    "EmployeeType": "permanent",
    "name": "John Smith",
    "phoneNumber": [
        {
            "Location": "home",
            "code": 44,
            "number": 456777737
        },
        {
            "location": "office",
            "code": 43,
            "number": 456777737
        }
    ]
}
```

Table 2 below shows an example of a JSON Schema for the employee record in JSON.

TABLE 2

```
"$schema": "http://json-schema.org/draft-04/schema#",
"id": "http://jsonschema.net",
```

TABLE 2-continued

```
"type": "object",
"properties": {
    "name": {
        "id": "http://jsonschema.net/name",
        "type": "string"
    },
    "employeeType": {
        "id": "http://jsonschema.net/employeeType",
        "type": "string",
        "enum": [
            "contractor",
            "permanent"
        ]
    },
    "address": {
        "id": "http://jsonschema.net/address",
        "type": "object",
        "required": [
            "streetAddress",
            "city"
        ],
        "properties": {
            "streetAddress": {
                "id": "http://jsonschema.net/address/streetAddress",
                "type": "string"
            },
            "city": {
                "id": "http://jsonschema.net/address/city",
                "type": "string"
            }
        }
    },
    "phoneNumber": {
        "id": "http://jsonschema.net/phoneNumber",
        "type": "array",
        "items": {
            "id": "http://jsonschema.net/phoneNumber/1",
            "type": "object",
            "required": [
                "location",
                "code",
                "number"
            ],
            "properties": {
                "location": {
                    "id": "http://jsonschema.net/phoneNumber/1/location",
                    "type": "string",
                    "enum": [
                        "home",
                        "office"
                    ]
                },
                "code": {
                    "id": "http://jsonschema.net/phoneNumber/1/code",
                    "type": "integer"
                },
                "number": {
                    "id": "http://jsonschema.net/phoneNumber/1/number",
                    "type": "integer"
                }
            }
        }
    }
},
"required": [
    "address",
    "employeeType",
    "name",
    "phoneNumber"
]
}
```

Figure 6B:
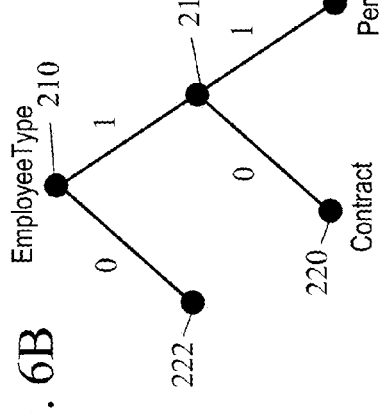
FIG. 6B shows a diagram of a portion of a statistical tree of the sample JSON Schema shown in Table 2.
Figure 6C:
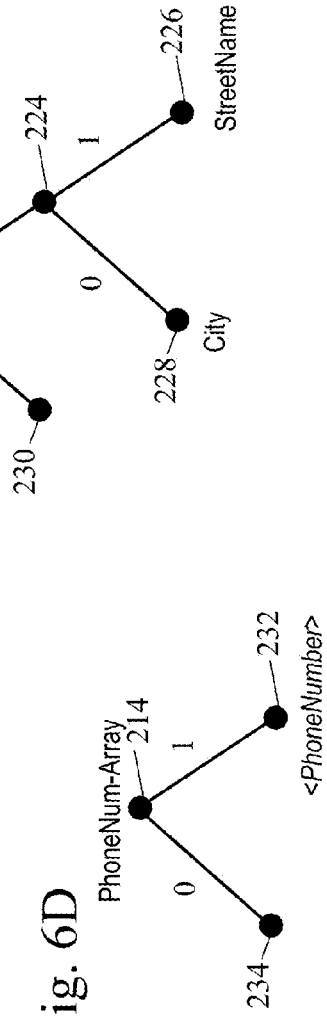
FIG. 6C shows a diagram of a portion of a statistical tree of the sample JSON Schema shown in Table 2.
Figure 6A:
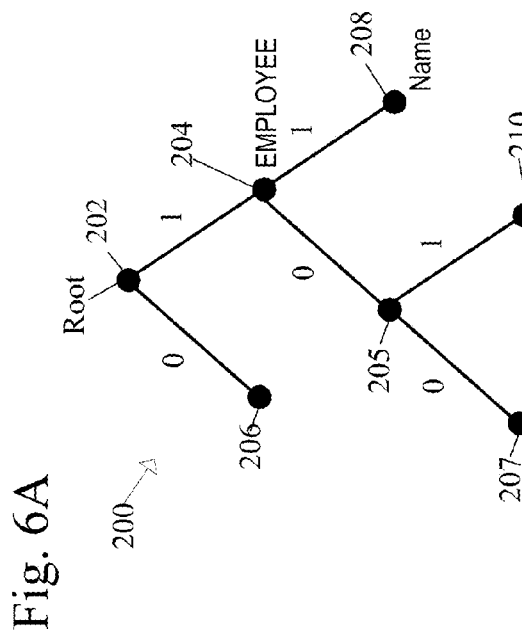
FIG. 6A show an example of statistical tree of the sample JSON Schema shown in Table 2.

Based on the sample JSON Schema of Table 2, the statistical tree 200 of the JSON Schema would be as shown in FIG. 6A, with the a root node 202 connected to a node 206 and a node of Employee 204 being defined by the fields of "PhoneNum-Array" 214, "Address" 212, "EmployeeType" 210 and "Name" 208 which are each represented as nodes in the tree. The fields of "EmployeeType" 210, "Address" 212, and "PhoneNum-Array" 214 are complex type fields. The field of "Name" 208 is a field that may have a value and is a leaf node of the statistical tree.

The corresponding statistical tree for the complex type field corresponding to "EmployeeType" 210 is shown in FIG. 6B and includes the fields of "contract" 220 or "permanent" 218 as well as node 222. The nodes 220, 218 representing the fields of "contract" and "permanent" are leaf nodes and may have corresponding values.

The corresponding statistical tree for the complex type field corresponding to "Address" 212 is shown in FIG. 6C and includes the fields of "City" 228 and "StreetName" 226 and node 230. The nodes 228, 226 representing the fields of "City" and "StreetName" are leaf nodes and may have corresponding values.

Figure 6D:
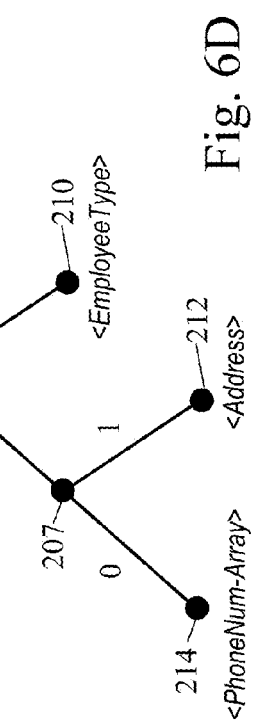
FIG. 6D shows a diagram of a portion of a statistical tree of the sample JSON Schema shown in Table 2.

The corresponding statistical tree for the complex type field corresponding to "PhoneNum-Array" 214 is shown in FIG. 6D and includes the complex type field of "PhoneNumber" 232 and node 234.

Figure 6F:
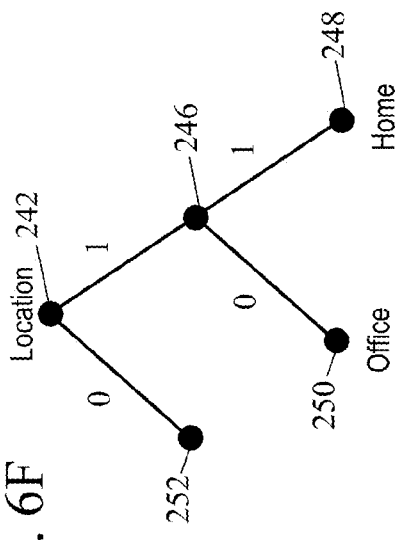
FIG. 6F shows a diagram of a portion of a statistical tree of the sample JSON Schema shown in Table 2.
Figure 6E:
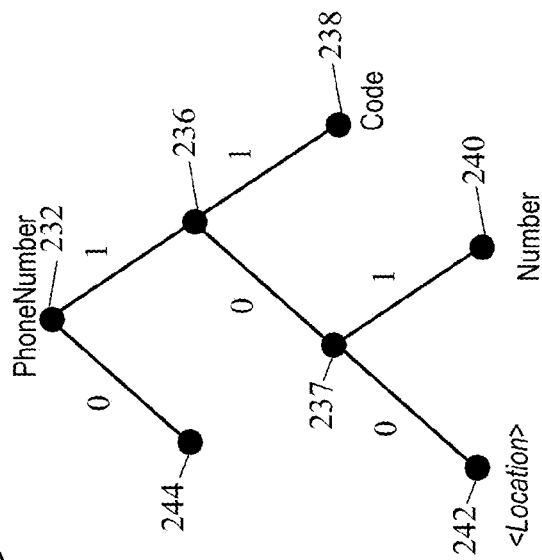
FIG. 6E shows a diagram of a portion of a statistical tree of the sample JSON Schema shown in Table 2.

FIG. 6E shows a corresponding statistical tree for the complex type field corresponding to "PhoneNumber" 232 and includes the fields of "Code" 238, "Number" 240 and the complex type field of "Location" 242, as well as node 244. The node 238 representing the field of "code" is a leaf node and might have a corresponding value.

FIG. 6F shows a corresponding statistical tree for the complex type field corresponding to "Location" 242 and includes the fields of "Office" 250, node 252 and "Home" 248. The nodes 250, 248 representing the fields of "Office" and "Home" are leaf nodes and may have corresponding values.

It should be noted that in FIGS. 7A-7G, the bit representation for the portion of the tree which is not been encoded has been omitted for clarity. Furthermore, merged node are not always present in the figures and have been omitted if not being discussed relative to the encoding of the JSON data.

FIG. 7A shows a diagram illustrating traversal of a statistical tree for encoding a portion of a JSON document shown in Table 1. A portion of the JSON fragment being encoded is shown in the Figure and is indicated by the box 280. The corresponding bit representation is indicated by the box 281.

The root node 202 is set and connected to the Employee node 204, the first element of the JSON fragment 280. The statistical tree is traversed until a genuine node of the tree corresponds to the fragment—which in this case is "Address". The address node 212 may be reached by taking a path from the root node 202, to the employee node 204 (indicated by a bit representation of '1'), the employee node 204 to node 205 (indicated by a bit representation of '0'), from node 205 to node 207 (indicated by a bit representation of '0'), and from node 207 to the address node 212 (indicated by a bit representation of '1'). The path from the root node 202 to the address node 212 is represented by "1001" as indicated by regular type.

The address node 212 is a predefined type of node and data associated with the node along with the respective tree type is retrieved and merged with the corresponding node. From the merged node of Address 212 to the city element 228 is encoded as '10' and is indicated by the italicized font. The binary sequence of "10" is appended to the previously encoded sequence.

The merged node of address 212 is set as the active node and the next element of the JSON data is encoded, which in this case is "StreetAddress". From the merged node of "address" 212, the path traverses to the node of StreetName 226 and is represented by the binary representation of "11" indicated by underlining Once all of the children of "Address" 212 have been encoded, the traversal resets to the parent genuine node of the root node which is presented by a '0' and is indicated in FIG. 7A by bold type. The "0" is appended to the previously encoded sequence.

Figure 7B:
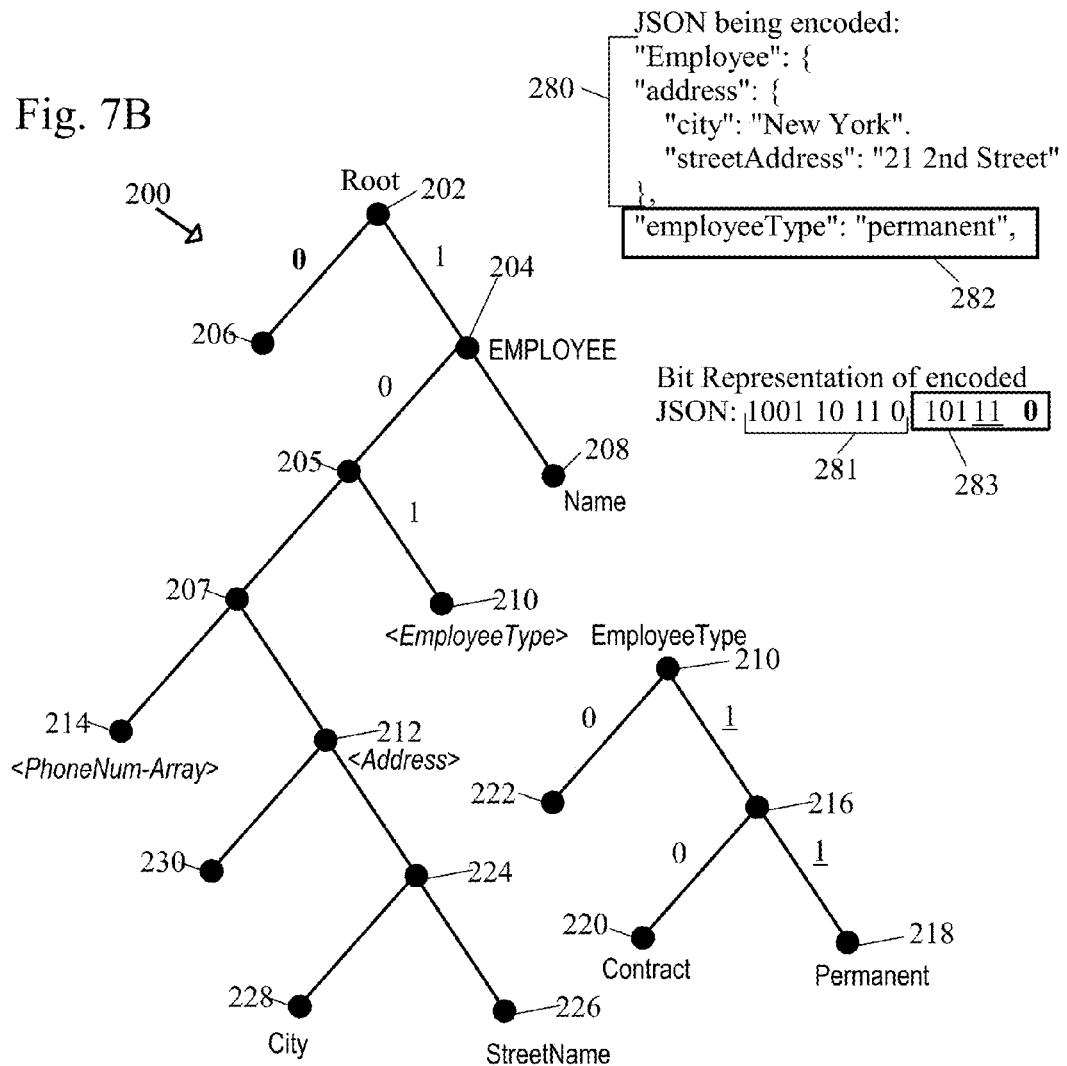
FIG. 7B shows a diagram illustrating traversal of a statistical tree for encoding a portion of a JSON document shown in Table 1.

The next element in the JSON fragment is indicated by the box 282, with the corresponding bit representation indicated by box 283 as shown in FIG. 7B. From the root node 202, the statistical tree is traversed until a genuine node of the tree corresponds to the fragment—which in this case is "EmployeeType". The EmployeeType node 210 may be reached by taking a path from the root node 202, to the employee node 204 (indicated by a bit representation of '1'), from the employee node 204 to node 205 (indicated by a bit representation of '0'), from node 205 to EmployeeType node 210. The path from the root node 202 to the EmployeeType node 210 is represented by "101" and is shown by regular type font. The EmployeeType node 210 is a predefined type of node and data associated with the node along with the respective tree type is retrieved and merged with the corresponding node.

From the merged node of EmployeeType 210 to the permanent node 218, the path is encoded as "11" and is indicated by the underlined font. The binary sequence of "101 11" is appended to the previously encoded sequence. Once all of the children of "EmployeeType" 210 have been encoded, the traversal resets to the parent genuine node of the root node which is presented by a '0' and is indicated in FIG. 7B by bold type. The "0" is appended to the previously encoded sequence.

Figure 7C:
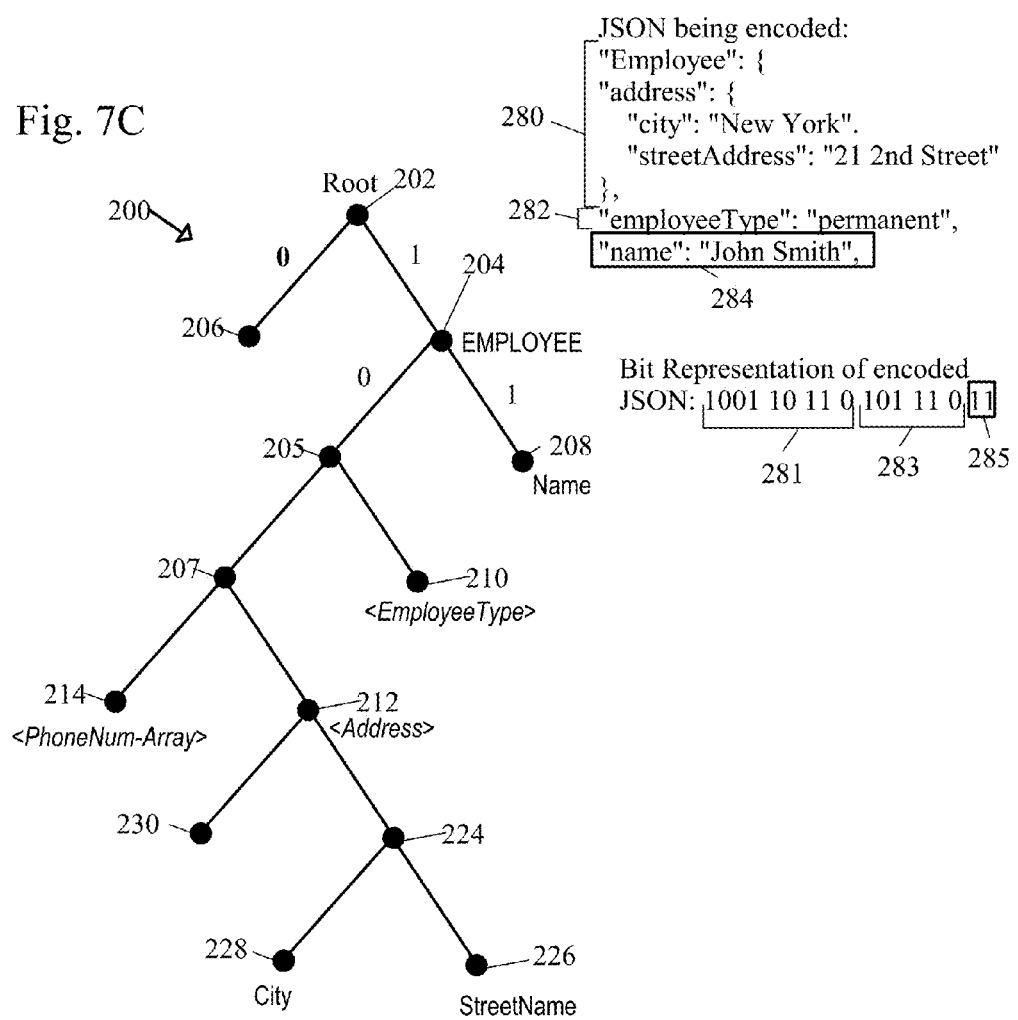
FIG. 7C shows a diagram illustrating traversal of a statistical tree for encoding a portion of a JSON document shown in Table 1.

The next element in the JSON fragment is indicated by the box 284, with the corresponding bit representation indicated by box 285 as shown in FIG. 7C. From the root node 202, the statistical tree is traversed until a genuine node of the tree corresponds to the fragment—which in this case is "Name". The "Name" node 208 may be reached by taking a path from the root node 202, to the employee node 204 (indicated by a bit representation of '1'), from the employee node 204 to the Name node 208 (indicated by a bit representation of '1'). The path from the root node 202 to the Name node 208 is represented by "11" and is appended to the previously encoded sequence. Since the Name node 208 does not represent a complex field type, the encoding moves to the next element of the JSON fragment.

Figure 7D:
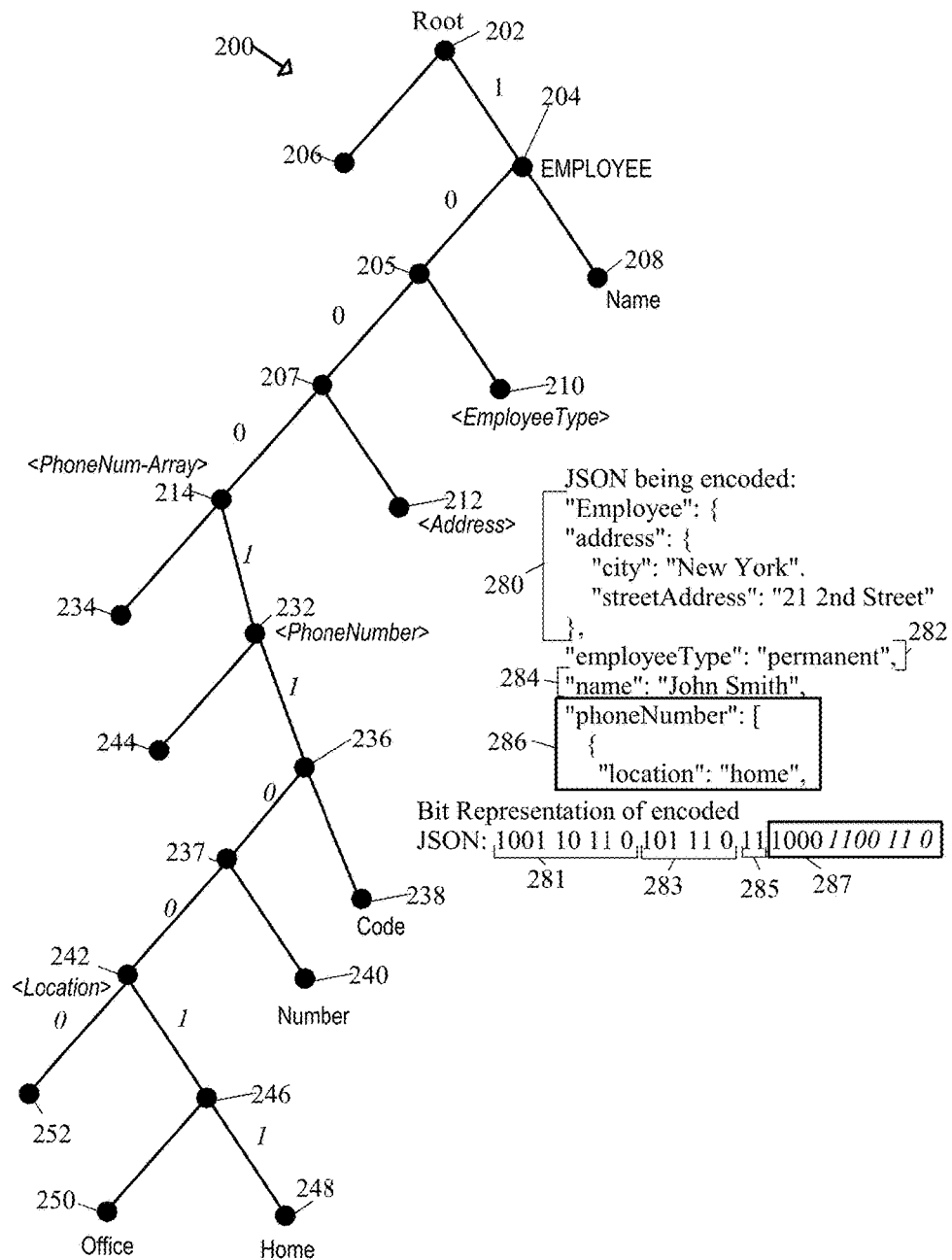
FIG. 7D shows a diagram illustrating traversal of a statistical tree for encoding a portion of a JSON document shown in Table 1.

The next element in the JSON fragment is indicated by the box 286, with the corresponding bit representation indicated by box 287 as shown in FIG. 7D. From the root node 202, the statistical tree is traversed until a genuine node of the tree corresponds to the fragment—which in this case is "phoneNumber". The "Phone Number" node 232 may be reached by taking a path from the root node 202, to the employee node 204 (indicated by a bit representation of '1'), from the employee node 204 to node 205 (indicated by a bit representation of '0'), from node 205 to node 207 (indicated by a bit representation of '0'), from node 207 to PhoneNum-Array node 214 (indicated by a bit representation of '0') and from PhoneNum-Array node 214 to PhoneNumber node 232 (indicated by bit representation of '1'). The path from the root node 202 to the PhoneNumber node 232 is represented by "1000 1", with the "1000" in regular type font and the "1" in italicized font. The PhoneNumber node 232 is a predefined type of node and data associated with the node along with the respective tree type is retrieved and merged with the corresponding node.

From the merged node of PhoneNumber 232 to the location node 242, the path is encoded as '100' and is indicated by the italicized font. The binary sequence of "1 00" is appended to the previously encoded sequence. Since the location node 242 is a predefined node type, data associated with the node along with the respective tree is retrieved and merged with the corresponding node. With the merged node of Location 242 set as the active node, the path from the Location ode 242 to the home node 248 would include the bit representation of "11" and is indicated by the italicized font. The binary sequence of "11" is appended to the previously encoded sequence. Since there is no other information in the JSON regarding the location, from the active node of Location 242, the traversal goes to node 252, which is represented by a '0' and is indicated in FIG. 7D by italicized type. The "0" is appended to the previously encoded sequence. The immediate parent node of PhoneNumber 232 is set as the parent node.

The next fragment of JSON to be encoded is the "code" as indicated by the box 288, with the corresponding bit representation indicated by box 289 in FIG. 7E. From the parent node of PhoneNumber 232, the statistical tree is traversed until a genuine node of the tree corresponds to the fragment—which in this case is "code". The "code" node 238 may be reached by taking a path from PhoneNumber node 232, to the node 236 (indicated by a bit representation of '1'), from node 236 to code node 238 (indicated by a bit representation of '1'). The path from the parent node of PhoneNumber node 232 to code node 238 is represented by a bit representation of "11" in italicized font (see box 289), which would be appended to the previously encoded sequence.

Figure 7F:
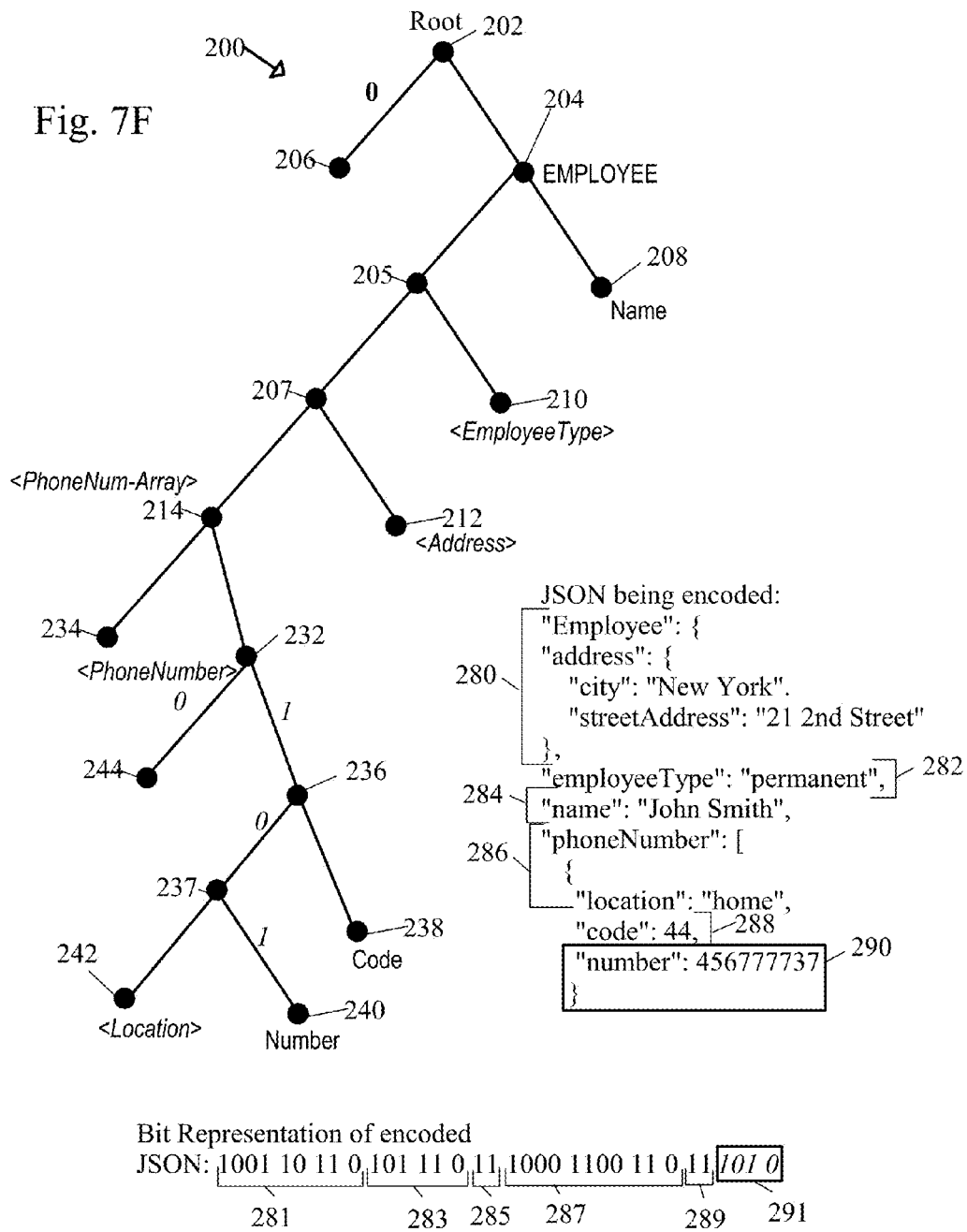
FIG. 7F shows a diagram illustrating traversal of a statistical tree for encoding a portion of a JSON document shown in Table 1.

The next fragment of JSON to be encoded is the "number" as indicated by the box 290, with the corresponding bit representation indicated by box 291 in FIG. 7F. From the parent node of PhoneNumber 232, the statistical tree is traversed until a genuine node of the tree corresponds to the fragment—which in this case is "number". The number node 240 may be reached by taking a path from PhoneNumber node 232, to the node 236 (indicated by a bit representation of '1'), from node 236 to node 237 (indicated by a bit representation of '0'), from node 237 to number node 240 (indicated by a bit representation of '1'). The path from the parent node of PhoneNumber node 232 to number node 240 is represented by a bit representation of "101" (see box 289), which would be appended to the previously encoded sequence. Since there is no other information in the JSON regarding the phone number relative to the home location, from the active node of PhoneNumber 232, the traversal goes to node 244, which is presented by a '0' and is indicated in FIG. 7F by italicized type. The "0" is appended to the previously encoded sequence. The PhoneNumber 232 node remains the active node.

Figure 7G:
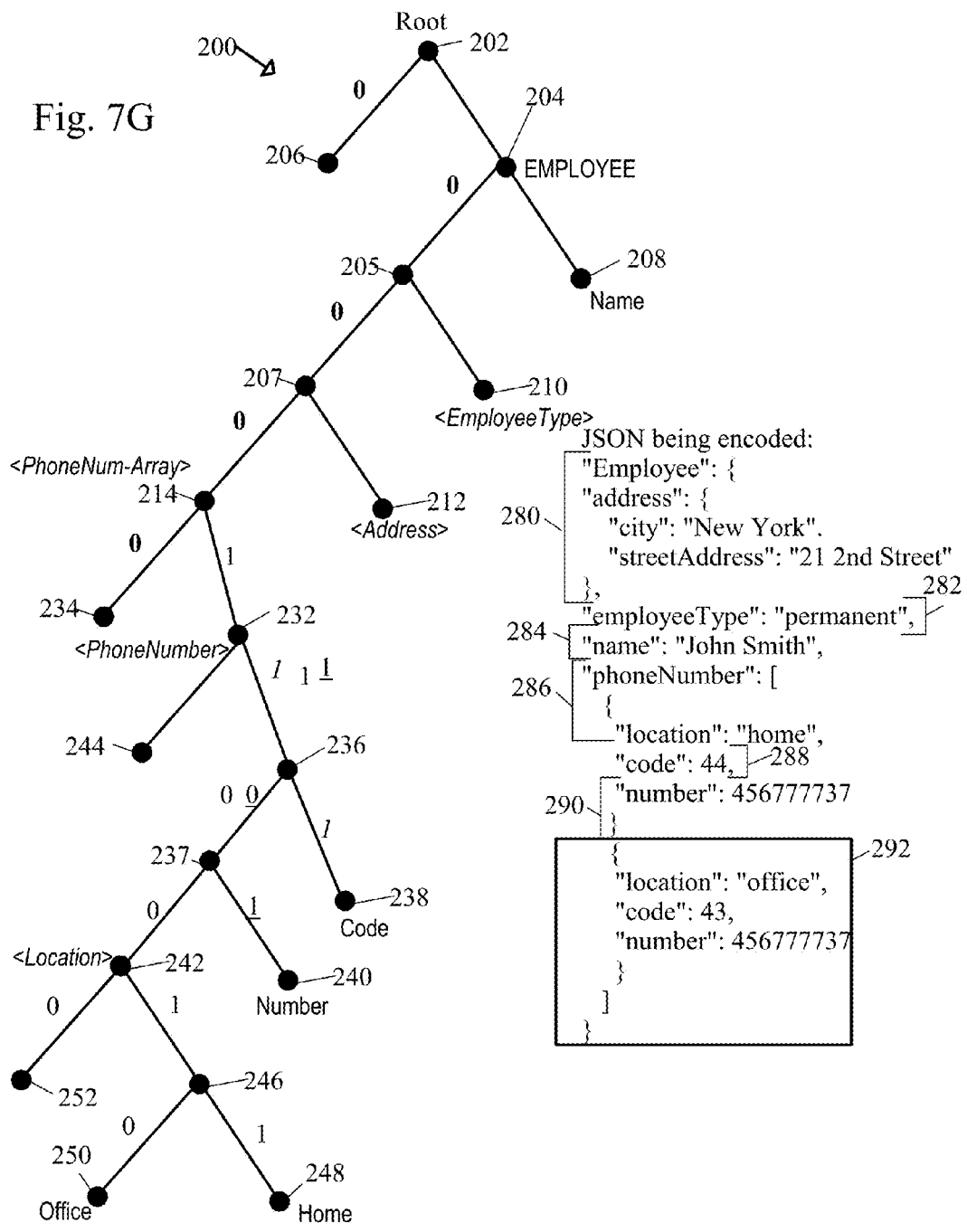
FIG. 7G shows a diagram illustrating traversal of a statistical tree for encoding a portion of a JSON document shown in Table 1.

The next fragment of the JSON to be encoded is the office location data as shown in box 292, with the corresponding bit representation indicated by box 293 of FIG. 7G. Since the active, genuine node remains as PhoneNumber 232, from this node, a path is traversed to the office node 250, the code node 238 and the number node 240 as described relative to FIGS. 7D-7F. After the sequence of "11000 10 0 11" is appended to the previously encoded sequence, the data in the JSON to be encoded is complete, and the path resets to the parent node of PhoneNumber 232 to node 244, to the previous parent node of PhoneNum-Array 214, to node 234, and to the employee node of 204. The bit representation of this path is "0 0 0" and is indicated in bold type in FIG. 7G.

During optimization, attributes or elements which have been used to a maximum and will not occur are removed from the tree and the tree is restructured. This optimization is performed during the process of encoding.

Therefore, the JSON of Table 1 would be encoded as the following bit representation: 1001 10 11 0 101 11 0 11 1000 1100 11 0 11 101 0 1100 10 0 11 101 000.

Figure 8A:
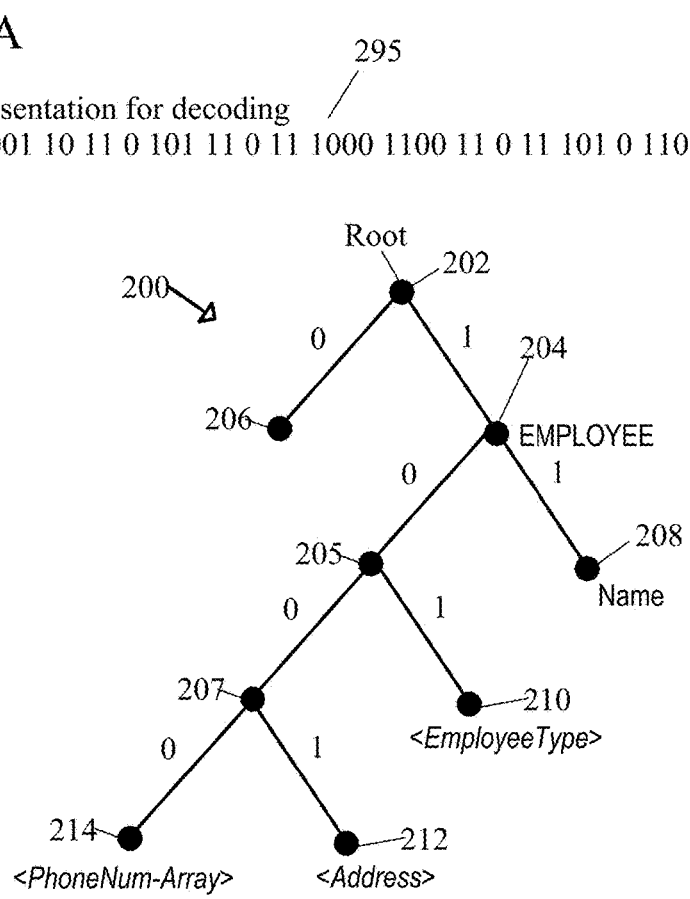
FIG. 8A shows a diagram illustrating traversal of a statistical tree for decoding a portion a bit representation of a JSON document shown in Table 1.
Figure 8B:
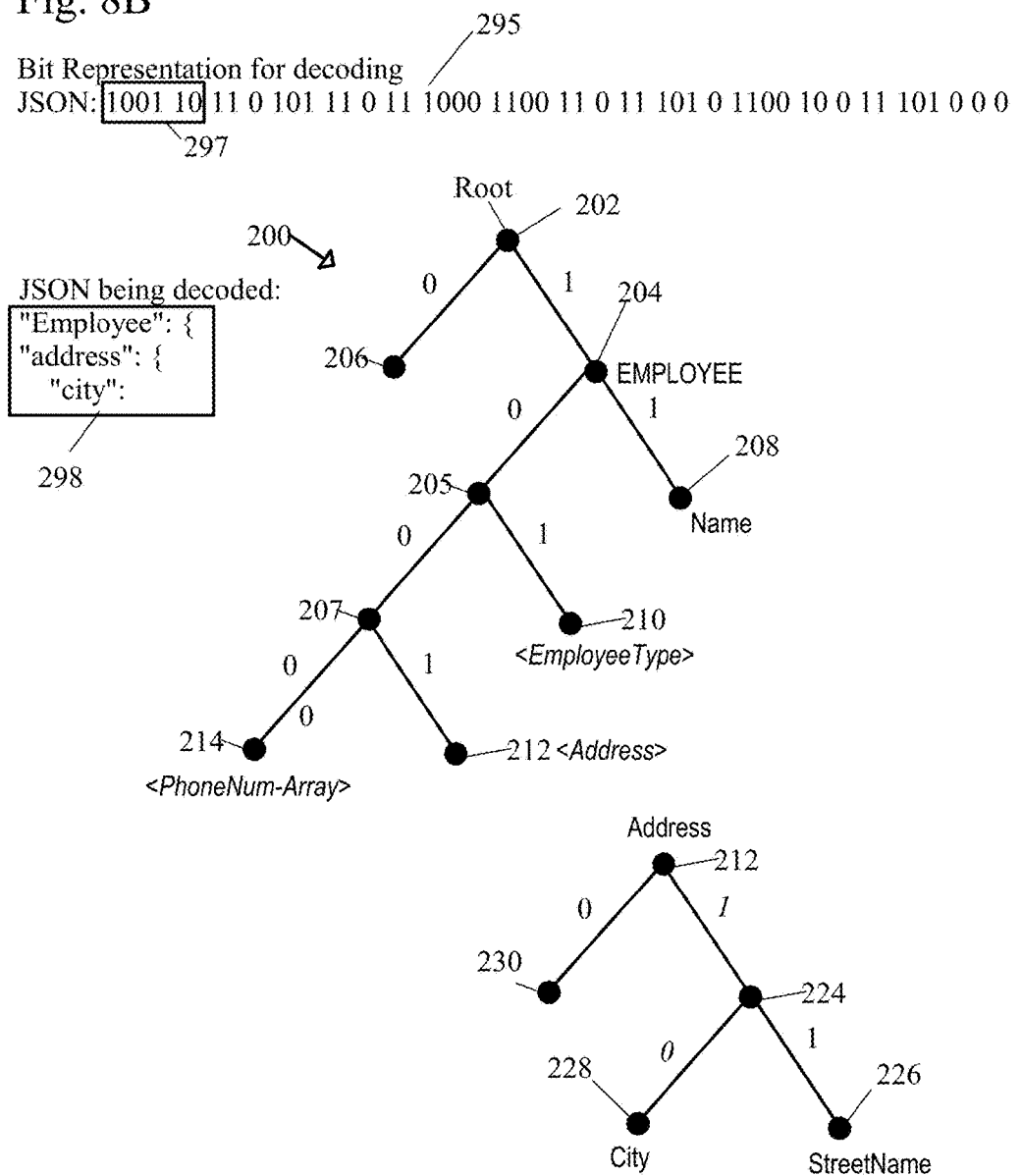
FIG. 8B shows a diagram illustrating traversal of a statistical tree for decoding a portion a bit representation of a JSON document shown in Table 1.

The decoding process involves traversing the statistical tree corresponding to a particular JSON document according to the binary encoded representation of the JSON document. Referring to FIGS. 8A-8B, a bit representation for decoding is indicated by reference number 295. A statistical tree based on a JSON schema is constructed. The JSON Schema statistical tree is indicated by reference number 200 and is shown in FIG. 8A.

Taking a first portion of the bit representation, for example "1001 10" as indicated by the box 297 in FIG. 8B, starting from the root node 202, the tree is traversed to fit the bit representation, and therefore the path traverses from the root node 202, to employee node 204 (indicated by a bit representation of '1'), from the employee node 204 to node 205 (indicated by a bit representation of '0'), from node 205 to node 207 (indicated by a bit representation of '0'), from node 207 to the address node 212 (indicated by a bit representation of '1'). Since the address node 212 is of a predefined type, the data associated with the node along with the respective tree type is retrieved and merged with the corresponding node. From the address node 212, and according to the bit representation, the path continues to node 224 (indicated by a bit representation of '1') and then to node 228 of city (indicated by a bit representation of '0'). Therefore, the bit representation can be decoded to represent the following JSON data as indicated by box 298 of:

---

"Employee": {
"address": {
"city": "New York",

---

The rest of bit representation is decoded in a similar manner until the JSON document is completely decoded.

During optimization, attributes or elements which have been used to a maximum and will not occur are removed from the tree and the tree is restructured. This optimization is performed during the process of decoding.

FIG. 9 illustrates internal and external components of device computer 52 and server computer 54 in which illustrative embodiments may be implemented. In FIG. 9, device computer 52 and server computer 54 include respective sets of internal components 800*a*, 800*b* and external components 900*a*, 900*b*. Each of the sets of internal components 800*a*, 800*b* includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828, and JSON compression program 66 are stored on one or more of the computer-readable tangible storage devices 830 for execution by one or more of the processors 820 via one or more of the RAMs 822 (which typically include cache memory). In the embodiment illustrated in FIG. 9, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Each set of internal components 800a, 800b also includes a R/W drive or interface 832 to read from and write to one or more portable computer-readable tangible storage devices 936 such as a CD-ROM, DVD, memory stick, magnetic tape, magnetic disk, optical disk or semiconductor storage device. The JSON compression program 66 can be stored on one or more of the portable computer-readable tangible storage devices 936, read via R/W drive or interface 832 and loaded into hard drive 830.

Each set of internal components 800a, 800b also includes a network adapter or interface 836 such as a TCP/IP adapter card. The JSON compression program 66 can be downloaded to the device computer 52, and the server computer 54 from an external computer via a network (for example, the Internet, a local area network or other, wide area network) and network adapter or interface 836. From the network adapter or interface 836, JSON compression program 66 is loaded into hard drive 830. The network may comprise copper wires, optical fibers, wireless transmission, routers, firewalls, switches, gateway computers and/or edge servers.

Each of the sets of external components 900a, 900b includes a computer display monitor 920, a keyboard 930, and a computer mouse 934. Each of the sets of internal components 800a, 800b also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

The JSON compression program 66 can be written in various programming languages including low-level, high-level, object-oriented or non object-oriented languages. Alternatively, the functions of a JSON compression program 66 can be implemented in whole or in part by computer circuits and other hardware (not shown).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for encoding a javascript object notation (JSON) document utilizing a statistical tree representing a JSON Schema, comprising the steps of:
   a computer establishing a root node of the statistical tree;
   the computer sequentially selecting each of a plurality of fragments of the JSON document;
   the computer locating a genuine node having properties corresponding to the respective fragment in the statistical tree corresponding to each of the selected fragments;
   the computer determining a binary code representing a path of traversal through the statistical tree to the corresponding genuine node from the root node;
   the computer ordering the binary code in accordance with the sequence of the respective fragments in the JSON document;
   the computer analyzing each located genuine node to determine the type of node, with the determined type being utilized to establish a next genuine node for encoding the sequentially next fragment of the JSON document; and
   the computer optimizing the statistical tree to reduce a number of bits comprising the binary code representing elements, enumerations, and attributes of the JSON document.

2. The method of claim 1, wherein the optimizing of the statistical tree further comprises for each genuine node which is of a determined type:
   setting an immediate parent node of the genuine node as the root node;
   searching for and counting a number of times the genuine node is found in the tree; and
   if the count has reached a maximum number of occurrences determined by the JSON Schema, removing the genuine node from the tree and moving a peer node of the genuine node indicated by '0' to the position of the '0' of the immediate parent node;
   wherein in the node removed was a fragment, and any other attributes are still being referenced, repeating the steps of setting the immediate parent node of the genuine node as the root node; searching for and counting the number of times the genuine node is found in the tree; and removing the genuine node from the tree and moving a peer node of the genuine node indicated by '0' to the position of the '0' of the immediate parent node until all attributes of the node representing a fragment have been removed.

3. The method of claim 2, further comprising the step of reordering the tree based on rules used to build the tree after all attributes being references by nodes representing fragments that exceeded a maximum occurrence have been removed and moved to the position of its immediate parent node.

4. The method of claim 3, wherein the rules comprise:
   a) attributes with enumerations are of a greater priority than other elements;
   b) a smaller the number of possible occurrences, a greater a priority;
   c) if multiple occurrences are assigned a same level of priority based on rules a) and b), one or more components are further prioritized according to a minimum number of occurrences of each component, wherein a higher minimum occurrence is assigned a higher level of priority; and
   d) if multiple occurrences are assigned a same level of priority based on rules a), b), and c), the one or more components are further prioritized based on a length of name of the JSON component, wherein a greater length of name is assigned a higher level of priority.

5. The method of claim 1, wherein if the analyzed genuine node is determined not to be a predefined type, the computer retrieves and merges the respective type tree corresponding to a type of the located node with the located node.

6. The method of claim 5, further comprising the step of the computer designating the located node merged with the retrieved type tree as the root node.

7. The method of claim 6, further comprising the step of the computer designating a parent genuine node of the root node as a new root node once traversal through a merged type tree has been performed.

8. The method of claim 7, wherein the designating of a new root node occurs when a non-genuine leaf node is located.

9. The method of claim 1, further comprising the step of the computer combining the binary code with the retrieved data to form the encoded JSON document.

10. A method for decoding a JSON document represented by a binary encoded sequence, the method comprising:
   a computer establishing a root node in a statistical tree representing a JSON Schema of the JSON document;
   the computer traversing the statistical tree from the designated root node to locate a next genuine node, the traversal based upon at least one portion of the binary encoded sequence bits;
   the computer generating a fragment of the JSON document, the fragment corresponding to the located genuine node;

the computer ordering the generated fragments in accordance with the order of the corresponding bits in the binary sequence;

the computer analyzing each located genuine node to determine the type of node, with the determined type being utilized to establish a next genuine node for decoding the sequentially next fragment of the JSON document; and the computer optimizing the statistical tree to reduce a number of bits comprising the binary code representing elements, enumerations, and attributes of the JSON document;

wherein each genuine node is analyzed to determine a type of the node, the type of node determining if a next genuine node is to be designated for traversing the statistical tree in according with the bits corresponding to the sequentially next at least one portion of the binary encoded sequence.

11. The method of claim 10, wherein if the genuine node is a leaf node whose path from a parent node is designated by a binary '0', the genuine parent node of the designated root node is assigned as the root node for traversing the statistical tree to decode the sequentially next at least one portion of the binary encoded sequence.

12. The method of claim 10, wherein the optimizing of the statistical tree further comprises for each genuine node which is of a determined type:

setting an immediate parent node of the genuine node as the root node;

searching for and counting a number of times the genuine node is found in the tree; and if the count has reached a maximum number of occurrences determined by the JSON Schema, removing the genuine node from the tree and moving a peer node of the genuine node indicated by '0' to the position of the '0' of the immediate parent node;

wherein in the node removed was a fragment, and any other attributes are still being referenced, repeating the steps of setting the immediate parent node of the genuine node as the root node; searching for and counting the number of times the genuine node is found in the tree; and removing the genuine node from the tree and moving a peer node of the genuine node indicated by '0' to the position of the '0' of the immediate parent node until all attributes of the node representing a fragment have been removed.

13. The method of claim 12, further comprising the step of reordering the tree based on rules used to build the tree after all attributes being references by nodes representing fragments that exceeded a maximum occurrence have been removed and moved to the position of its immediate parent node.

14. The method of claim 13, wherein the rules comprise:

a) attributes with enumerations are of a greater priority than other elements;

b) a smaller the number of possible occurrences, a greater a priority; and c) if multiple occurrences are assigned a same level of priority based on rules a) and b), one or more components are further prioritized according to a minimum number of occurrences of each component, wherein a higher minimum occurrence is assigned a higher level of priority;

d) if multiple occurrences are assigned a same level of priority based on rules a), b), and c), the one or more components are further prioritized based on a length of name of the JSON component, wherein a greater length of name is assigned a higher level of priority.

15. A computer program product for encoding a javascript object notation (JSON) document utilizing a statistical tree representing a JSON Schema with a computer comprising at least one processor, one or more memories, one or more computer readable storage media, the computer program product comprising a computer readable storage medium having program instructions embodied therewith, the program instructions executable by the computer to perform a method comprising:

establishing, by the computer, a root node of the statistical tree;

sequentially, by the computer, selecting each of a plurality of fragments of the JSON document;

locating, by the computer, a genuine node having properties corresponding to the respective fragment in the statistical tree corresponding to each of the selected fragments;

determining, by the computer, a binary code representing a path of traversal through the statistical tree to the corresponding genuine node from the root node;

ordering, by the computer, the binary code in accordance with the sequence of the respective fragments in the JSON document;

analyzing, by the computer, each located genuine node to determine the type of node, with the determined type being utilized to establish a next genuine node for encoding the sequentially next fragment of the JSON document; and optimizing, by the computer, the statistical tree to reduce a number of bits comprising the binary code representing elements, enumerations, and attributes of the JSON document.

16. The computer program product of claim 15, wherein the optimizing of the statistical tree further comprises for each genuine node which is of a determined type:

setting, by the computer, an immediate parent node of the genuine node as the root node;

searching for and counting, by the computer, a number of times the genuine node is found in the tree; and if the count has reached a maximum number of occurrences determined by the JSON Schema, removing, by the computer, the genuine node from the tree and moving, by the computer, a peer node of the genuine node indicated by '0' to the position of the '0' of the immediate parent node;

wherein in the node removed was a fragment, and any other attributes are still being referenced, repeating the steps of setting, by the computer, the immediate parent node of the genuine node as the root node; searching for and counting, by the computer, the number of times the genuine node is found in the tree; and removing, by the computer, the genuine node from the tree and moving, by the computer, a peer node of the genuine node indicated by '0' to the position of the '0' of the immediate parent node until all attributes of the node representing a fragment have been removed.

17. The computer program product of claim 16, further comprising the step of reordering, by the computer, the tree based on rules used to build the tree after all attributes being references by nodes representing fragments that exceeded a maximum occurrence have been removed and moved to the position of its immediate parent node.

18. The computer program product of claim 17, wherein the rules comprise:

a) attributes with enumerations are of a greater priority than other elements;
b) a smaller the number of possible occurrences, a greater a priority;
c) if multiple occurrences are assigned a same level of priority based on rules a) and b), one or more components are further prioritized according to a minimum number of occurrences of each component, wherein a higher minimum occurrence is assigned a higher level of priority; and
d) if multiple occurrences are assigned a same level of priority based on rules a), b), and c), the one or more components are further prioritized based on a length of name of the JSON component, wherein a greater length of name is assigned a higher level of priority.

19. The computer program product of claim 15, wherein if the analyzed genuine node is determined not to be a predefined type, retrieving and merging, by the computer, the respective type tree corresponding to the type of the located node with the located node.

20. The computer program product of claim 19, further comprising designating, by the computer, the located node merged with the retrieved type tree as the root node.

21. A computer system for encoding a javascript object notation (JSON) document utilizing a statistical tree representing a JSON Schema comprising a computer comprising at least one processor, one or more memories, one or more computer readable storage media having program instructions executable by the computer to perform the program instructions comprising:
    establishing, by the computer, a root node of the statistical tree;
    sequentially, by the computer, selecting each of a plurality of fragments of the JSON document;
    locating, by the computer, a genuine node having properties corresponding to the respective fragment in the statistical tree corresponding to each of the selected fragments;
    determining, by the computer, a binary code representing a path of traversal through the statistical tree to the corresponding genuine node from the root node;
    ordering, by the computer, the binary code in accordance with the sequence of the respective fragments in the JSON document;
    analyzing, by the computer, each located genuine node to determine the type of node, with the determined type being utilized to establish a next genuine node for encoding the sequentially next fragment of the JSON document; and
    optimizing, by the computer, the statistical tree to reduce a number of bits comprising the binary code representing elements, enumerations, and attributes of the JSON document.

22. The computer system of claim 21, wherein the optimizing of the statistical tree further comprises for each genuine node which is of a determined type:
    setting, by the computer, an immediate parent node of the genuine node as the root node;
    searching for and counting, by the computer, a number of times the genuine node is found in the tree; and
    if the count has reached a maximum number of occurrences determined by the JSON Schema, removing, by the computer, the genuine node from the tree and moving, by the computer, a peer node of the genuine node indicated by '0' to the position of the '0' of the immediate parent node;
    wherein in the node removed was a fragment, and any other attributes are still being referenced, repeating the steps of setting, by the computer, the immediate parent node of the genuine node as the root node; searching for and counting, by the computer, the number of times the genuine node is found in the tree; and removing, by the computer, the genuine node from the tree and moving, by the computer, a peer node of the genuine node indicated by '0' to the position of the '0' of the immediate parent node until all attributes of the node representing a fragment have been removed.

23. The computer system of claim 22, further comprising the step of reordering, by the computer, the tree based on rules used to build the tree after all attributes being references by nodes representing fragments that exceeded a maximum occurrence have been removed and moved to the position of its immediate parent node.

24. The computer system of claim 23, wherein the rules comprise:
    a) attributes with enumerations are of a greater priority than other elements;
    b) a smaller the number of possible occurrences, a greater a priority;
    c) if multiple occurrences are assigned a same level of priority based on rules a) and b), one or more components are further prioritized according to a minimum number of occurrences of each component, wherein a higher minimum occurrence is assigned a higher level of priority; and
    d) if multiple occurrences are assigned a same level of priority based on rules a), b), and c), the one or more components are further prioritized based on a length of name of the JSON component, wherein a greater length of name is assigned a higher level of priority.

25. The computer system of claim 21, wherein if the analyzed genuine node is determined not to be a predefined type, retrieving and merging, by the computer, the respective type tree corresponding to the type of the located node with the located node.

* * * * *